US009145293B2

(12) United States Patent
Mao et al.

(10) Patent No.: US 9,145,293 B2
(45) Date of Patent: Sep. 29, 2015

(54) MICRO-ELECTRO-MECHANICAL SYSTEM BASED FOCUSING DEVICE AND MANUFACTURING METHOD THEREOF

(71) Applicant: Lexvu Opto Microelectronics Technology (Shanghai) Ltd, Shanghai (CN)

(72) Inventors: Jianhong Mao, Shanghai (CN); Fengqin Han, Shanghai (CN); Deming Tang, Shanghai (CN); Lei Zhang, Shanghai (CN)

(73) Assignee: LEXVU OPTO MICROELECTRONICS TECHNOLOGY (SHANGHAI) LTD, Shanghai (CN)

( * ) Notice: Subject to any disclaimer, the term of this patent is extended or adjusted under 35 U.S.C. 154(b) by 0 days.

(21) Appl. No.: 14/086,321

(22) Filed: Nov. 21, 2013

(65) Prior Publication Data

US 2014/0139937 A1 May 22, 2014

(30) Foreign Application Priority Data

Nov. 22, 2012 (CN) .......................... 2012 1 0477140

(51) Int. Cl.
*G02B 26/00* (2006.01)
*B81C 1/00* (2006.01)
*G02B 7/08* (2006.01)

(52) U.S. Cl.
CPC .............. *B81C 1/00539* (2013.01); *G02B 7/08* (2013.01); *G02B 26/00* (2013.01)

(58) Field of Classification Search
CPC ........... G02B 26/0825; G02B 26/0841; G02B 26/085; G02B 26/0858; G02B 26/00; B81C 1/00539
USPC ........... 359/846, 834, 224.1, 225.1, 666, 811, 359/847
See application file for complete search history.

(56) References Cited

U.S. PATENT DOCUMENTS

| 2008/0144185 | A1* | 6/2008 | Wang et al. | 359/665 |
| 2008/0218873 | A1* | 9/2008 | Batchko et al. | 359/665 |
| 2009/0310209 | A1* | 12/2009 | Aschwanden et al. | 359/291 |
| 2010/0067130 | A1* | 3/2010 | Kim et al. | 359/824 |

* cited by examiner

*Primary Examiner* — Scott J Sugarman
*Assistant Examiner* — William R Alexander
(74) *Attorney, Agent, or Firm* — Harness, Dickey & Pierce, P.L.C.

(57) ABSTRACT

A micro-electro-mechanical system based focusing device and manufacturing method thereof are disclosed. The system includes: a deformable lens, multiple groups of conductive deformable crossbeams and conductive structs; and one or more fixed parts. In each group, each conductive deformable crossbeam corresponds to a conductive struct. The conductive deformable crossbeams and the conductive structs are arranged around the deformable lens and spaced from each other. The conductive deformable crossbeams are suspended in the air, their inner edges are connected with an external edge of the deformable lens and their external edges are connected with the fixed parts. The conductive structs are fixedly connected with the fixed parts and remain stationary. Electrostatic force between the conductive deformable crossbeam and the conductive struct causes the deformable lens to be stretched and rotate, thus, surface curvature and focal length are changed. The device has a small size, low power consumption and low manufacturing cost.

20 Claims, 11 Drawing Sheets

MICRO-ELECTRO-MECHANICAL SYSTEM BASED FOCUSING DEVICE AND MANUFACTURING METHOD THEREOF

CROSS-REFERENCE TO RELATED APPLICATIONS

The present application claims priority to Chinese patent application No. 201210477140.9, filed on Nov. 22, 2012, and entitled "MICRO-ELECTRO-MECHANICAL SYSTEM BASED FOCUSING DEVICE AND MANUFACTURING METHOD THEREOF", and the entire disclosure of which is incorporated herein by reference.

FIELD OF THE DISCLOSURE

The present disclosure generally relates to the field of semiconductor manufacturing, and more particularly, to a micro-electro-mechanical system based focusing device and a manufacturing method thereof.

BACKGROUND OF THE DISCLOSURE

Nowadays, in cell phones or other handheld devices, micro cameras which has a much smaller size than a common camera module, are used more and more widely. Generally, a micro camera module includes an image sensor, one or more image processing chips and a focusing lens system. A fixed focusing lens system is mainly used in a micro camera which is integrated in a cell phone or other handheld devices due to its size and manufacturing cost limitation.

In practice, micro focusing devices have become a development trend and research focus. In a current automatic focusing camera, a voice motor technology of a focal length is adjusted by the retraction and repulsion of magnetism, where a voice motor technology device has a large size and high power consumption, and the adjusting rate is slow. Therefore, to be assembled in a micro camera module conveniently, a focusing device should have a small size, low power consumption and low manufacturing cost.

How to realize an automatic focusing function in a micro camera module which has a very small size, low power consumption and low manufacturing cost has become a problem exigent to be solved.

SUMMARY

Embodiments of the present disclosure provide a Micro-Electro-Mechanical System (MEMS) based focusing device and a manufacturing method thereof, where an automatic focusing function is realized, and power consumption, manufacturing cost and the size of the device are reduced.

According to one embodiment of the present disclosure, an MEMS based focusing device is provided, including:
a deformable lens;
multiple groups of conductive deformable crossbeams and conductive structs, where in each group, each conductive deformable crossbeam corresponds to an adjacent conductive struct, the conductive deformable crossbeams and the conductive structs are arranged around the deformable lens, each conductive deformable crossbeam and each conductive struct are spaced from each other, the conductive deformable crossbeams are suspended in the air, and inner edges of the conductive deformable crossbeams are fixedly connected with an external edge of the deformable lens; and
one or more fixed parts, where external edges of the conductive deformable crossbeams are fixedly connected with the fixed parts, and the conductive structs are fixedly connected with the fixed parts and remain stationary.

Electrostatic force between the conductive deformable crossbeam and the conductive struct in each group enables the conductive deformable crossbeam to move relatively to the conductive struct, so that the deformable lens is stretched and rotates around an optical axis of the deformable lens clockwise or anticlockwise. As a result, surface curvature and focal length of the deformable lens may be changed.

By attraction of opposite charges between the conductive deformable crossbeams and the conductive structs, the conductive deformable crossbeams move relatively to the conductive structs gradually, so that the inner edges of the conductive deformable crossbeams drive the external edge of the deformable lens to be stretched in a radial direction and drive the deformable lens to rotate around the optical axis clockwise or anticlockwise. As a result, surface curvature of the deformable lens is changed and a focusing function is reached. The conductive deformable crossbeams are suspended in the air, and the external edges thereof are fixedly connected with the fixed parts and remain stationary. The conductive structs are fixedly connected with the fixed parts and remain stationary. The fixed parts may improve the stability and accuracy of focusing of the deformable lens, and provide convenience for the assembly of the MEMS based focusing device.

Optionally, the multiple groups of conductive deformable crossbeams and conductive structs are symmetrically arranged around the deformable lens with respect to the optical axis thereof. Optionally, the multiple groups of conductive deformable crossbeams and conductive structs are arranged around a circle of the deformable lens and rotationally symmetric with respect to the optical axis of the deformable lens. When rotationally stretching the deformable lens, the conductive deformable crossbeams and conductive structs in the rotationally symmetric arrangement enable every side of the deformable lens to share averaged force, which may prevent the deformable lens being damaged and keep the optical axis thereof unchanged.

Optionally, along a radial direction of the deformable lens outwardly, a distance between the conductive deformable crossbeam and the conductive struct in each group may decrease gradually. During a process that the conductive struct attracts the conductive deformable crossbeam, under a relatively small electric potential difference, an external part of the conductive deformable crossbeam nearest to the conductive struct may be attracted approaching the conductive struct or in contact with the conductive struct partially, so that the deformable lens is somewhat rotationally stretched. Then, under a gradually increased electric potential difference, an inner part of the conductive deformable crossbeam far away from the conductive struct may gradually approach the conductive struct due to the electrostatic attraction, so that the deformable lens is further rotationally stretched. In such, the conductive deformable crossbeam may be attracted and the focal length of the deformable lens may be changed greatly.

Optionally, each of the conductive deformable crossbeams may take a shape of sickle which includes a bending part and a flat part. An inner edge of the bending part is fixedly connected with the external edge of the deformable lens. During a process that the conductive struct attracts the conductive deformable crossbeam, the bending part can rotationally stretch the deformable lens at utmost, so that curvature of the deformable lens is changed greatly.

Optionally, along a radial direction of the deformable lens, a side of the conductive deformable crossbeam may be flat. Optionally, a cross section of the conductive deformable crossbeam may be a parallel tetrahedron structure which is long and narrow in a vertical direction and a process for manufacturing the conductive deformable crossbeam is simple.

Optionally, the conductive deformable crossbeams may include a plurality of first conductive deformable crossbeams and a plurality of second conductive deformable crossbeams, and the conductive structs may include a plurality of first conductive structs which correspond to the plurality of first conductive deformable crossbeams and a plurality of second conductive structs which correspond to the plurality of second conductive deformable crossbeams. The plurality of first conductive deformable crossbeams and the plurality of second conductive deformable crossbeams are arranged around the deformable lens, and each first conductive deformable crossbeam and each second conductive deformable crossbeam are spaced from each other. The plurality of first conductive structs and the plurality of second conductive structs are arranged around the deformable lens, and each first conductive struct and each second conductive struct are spaced from each other. When the conductive deformable crossbeam and the conductive struct in each group have opposite charges, the first conductive deformable crossbeam and the second conductive deformable crossbeam may have opposite charges, and the first conductive struct and the second conductive struct may have opposite charges, so that the conductive deformable crossbeam has opposite charges with one adjacent conductive struct and has like charges with the other adjacent conductive struct. Therefore, almost all the conductive structs attract their corresponding conductive deformable crossbeams disposed on a same side of them, which ensures the deformable lens to be rotationally stretched towards a same direction, and this is benefit to a change of the focal length and to the stability of the optical axis of the deformable lens.

Optionally, in each group of the conductive deformable crossbeam and the conductive struct, each conductive deformable crossbeam corresponds to one adjacent conductive struct. The conductive deformable crossbeams may include a plurality of first conductive deformable crossbeams and a plurality of second conductive deformable crossbeams, and the conductive structs may include a plurality of first conductive structs which correspond to the plurality of first conductive deformable crossbeams and a plurality of second conductive structs which correspond to the plurality of second conductive deformable crossbeams. The plurality of first conductive deformable crossbeams and the plurality of second conductive deformable crossbeams are arranged around a circle of the deformable lens, and each first conductive deformable crossbeam and each second conductive deformable crossbeam are spaced from each other. The plurality of first conductive structs and the plurality of second conductive structs are arranged around the circle of the deformable lens, and each first conductive struct and each second conductive struct are spaced from each other. When electrostatic repulsion occurs between the conductive deformable crossbeam and the conductive struct in each group, the first conductive deformable crossbeams and the second conductive deformable crossbeams may have opposite charges, and the first conductive structs and the second conductive structs may have opposite charges. Optionally, in each group, an inner side of the flat part of the conductive deformable crossbeam may be parallel with an inner side of the conductive struct which is opposite to the inner side of the flat part. When electrostatic repulsion occurs between the conductive deformable crossbeam and the conductive struct, a distance therebetween may be increased, so that the conductive deformable crossbeam has opposite charges with one adjacent conductive struct and has like charges with the other adjacent conductive struct. Therefore, almost all the conductive structs repel their corresponding conductive deformable crossbeams disposed on a same side of them, which ensures the deformable lens to be rotationally stretched towards a same direction. When electrostatic repulsion occurs between the conductive deformable crossbeam and the conductive struct, an inside part of the conductive deformable crossbeam moves away from the conductive struct and then an outside part thereof moves away from the conductive struct gradually, which enables the conductive deformable crossbeam to move under electrostatic repulsion with relatively small intensity and changes the focal length of the deformable lens, and this is benefit to the change of the focal length and to reduction of power consumption.

Optionally, in each group of the conductive deformable crossbeam and the conductive struct, each conductive deformable crossbeam corresponds to two adjacent conductive structs which are disposed on two sides of the conductive deformable crossbeam. The conductive deformable crossbeams may include a plurality of first conductive deformable crossbeams and a plurality of second conductive deformable crossbeams, and the conductive structs may include a plurality of first conductive structs and a plurality of third conductive structs which correspond to the plurality of first conductive deformable crossbeams and a plurality of second conductive structs and a plurality of fourth conductive structs which correspond to the plurality of second conductive deformable crossbeams. The plurality of first conductive deformable crossbeams and the plurality of second conductive deformable crossbeams are arranged around a circle of the deformable lens, and each first conductive deformable crossbeam and each second conductive deformable crossbeam are spaced from each other. The plurality of first conductive structs and the plurality of second conductive structs are arranged around the circle of the deformable lens, and each first conductive struct and each second conductive struct are spaced from each other. The plurality of third conductive structs and the plurality of fourth conductive structs are arranged around the circle of the deformable lens, and each third conductive struct and each fourth conductive struct are spaced from each other. When electrostatic attraction occurs between the conductive deformable crossbeam and one adjacent conductive struct, and electrostatic repulsion occurs between the conductive deformable crossbeam and the other adjacent conductive struct in each group, the first conductive deformable crossbeams and the second conductive deformable crossbeams may have opposite charges, the first conductive structs and the second conductive structs may have opposite charges, and the third conductive structs and the fourth conductive structs may have opposite charges. Optionally, in each group, an angle is formed between an inner side of the flat part of the conductive deformable crossbeam and an inner side of one adjacent conductive struct which are opposite, and the flat part may be parallel with an inner side of the other adjacent conductive struct which is opposite to the flat part. When electrostatic attraction occurs between the conductive deformable crossbeam and one adjacent conductive struct, a distance therebetween may decrease, electrostatic repulsion may occur between the conductive deformable crossbeam and the other adjacent conductive struct, and a distance between the conductive deformable crossbeam and the other adjacent conductive struct may be increased. When the conductive deformable crossbeam and the conductive structs are electrified, the conductive deformable crossbeam may sustain two forces with a same direction at a same time, one is an electrostatic attractive force and the other is an electrostatic repulsive force, where the electrostatic attraction occurs between the conductive deformable crossbeam and the one adjacent conductive struct which has an angle with the flat part of the conductive deformable crossbeam, and the electrostatic repulsion occurs between the conductive deformable crossbeam and the other adjacent conductive struct which is parallel with the flat part of conductive deformable crossbeam. Under these two forces, the conductive deformable crossbeams may move faster, the focal length may be adjusted faster, and the conductive deformable crossbeams may rotate towards one direction. When the conductive deformable crossbeam and the conductive structs are electrified, the conductive deformable crossbeam may approach one adjacent conductive struct gradually and be away from the other adjacent conductive struct, so that almost all the conductive deformable crossbeams can move towards one direction. And when the conductive structs take few charges, the conductive deformable crossbeams can move rotationally and a change in focal length of the deformable lens may be maximum.

Optionally, an angle may be formed between an inner side of the flat part of the conductive deformable crossbeam and an inner side of the conductive struct which are opposite in each group. When electrostatic attraction occurs between the conductive deformable crossbeam and the conductive struct, a distance therebetween may decrease. During a process that the conductive struct attracts the conductive deformable crossbeam, an external part of the conductive deformable crossbeam nearest to the conductive struct may rotationally stretch the deformable lens first due to the electrostatic attraction, and then an inner part of the conductive deformable crossbeam far away from the conductive struct may rotationally stretch the deformable lens due to the electrostatic attraction. In such, the conductive deformable crossbeam may be attracted and the focal length of the deformable lens may be changed greatly.

Optionally, the angle between the inner side of the flat part of the conductive deformable crossbeam and the inner side of the conductive struct which are opposite in each group may range from 1° to 60°. Optionally, the angle between the inner side of the flat part of the conductive deformable crossbeam and the inner side of the conductive struct which are opposite in each group may range from 5° to 50°. The smaller the angle is, the less the deformable lens is rotationally stretched and the less the focal length is changed; and vice versa.

Optionally, a dielectric layer may be formed on inner sides of the conductive deformable crossbeam and the conductive struct which are opposite in each group. The dielectric layer may include silicon oxide, a high-K dielectric material or a low-K dielectric material. During the interattraction process between the conductive struct and the conductive deformable crossbeam, the dielectric layer may prevent wipeout of charges effectively.

Optionally, an external surface of the deformable lens may be convex or concave. The radius of curvature of the deformable lens may be chosen according to practical requirements.

Optionally, the deformable lens may include transparent plastic.

Optionally, anyone of the conductive deformable crossbeams, the conductive structs and the fixed parts may include a semiconductor material. Optionally, the conductive deformable crossbeams, the conductive structs and the fixed parts may include silicon. To increase the conductivity of the conductive deformable crossbeams and the conductive structs, they may include various doped silicon. In some embodiments, the fixed parts may include silicon dioxide.

Optionally, the focusing device may have a thickness ranging from 1 μm to 1000 μm. In some embodiments, the focusing device may have a thickness ranging from 10 μm to 100 μm. The smaller the thickness is, the smaller the size of the focusing device is. A smaller size may be benefit to thermal radiation during the operation of the focusing device.

Optionally, the focusing device may include one or more adjustable power supply devices and one or more charge removing devices. The one or more adjustable power supply devices may be configured to provide charges to the conductive deformable crossbeams and the conductive structs. The one or more charge removing devices may be configured to remove charges on the conductive deformable crossbeams and the conductive structs. Charge amount on the conductive deformable crossbeams and the conductive structs can be controlled by the one or more adjustable power supply devices, so that changes in curvature and the focal length of the deformable lens may be controlled accurately. When there is no need to change the focal length, charges on the conductive deformable crossbeams and the conductive structs may be removed, so that the deformable lens may be restorable.

According to one embodiment of the present disclosure, a method for manufacturing an MEMS based focusing device is provided, including:

providing a semiconductor substrate;

etching an upper layer of the semiconductor substrate by dry etching or wet etching to form multiple groups of conductive deformable crossbeams and conductive structs and one or more fixed parts, and forming a circular groove in the center of inner edges of the conductive deformable crossbeams, where in each group of conductive deformable crossbeam and conductive struct, each conductive deformable crossbeam corresponds to an adjacent conductive struct, the conductive deformable crossbeams and the conductive structs are arranged around the circular groove, each conductive deformable crossbeam and each conductive struct are spaced from each other, external edges of the conductive deformable crossbeams are fixedly connected with the fixed parts, and the conductive structs are fixedly connected with the fixed parts and remain stationary;

adhering a plate on an upper surface of the semiconductor substrate;

thinning a lower layer of the semiconductor substrate, releasing the multiple groups of conductive deformable crossbeams and conductive structs to make the conductive deformable crossbeams suspended in the air;

forming a deformable lens in the circular groove, an external edge of the deformable lens being fixedly connected with inner edges of the conductive deformable cross beams; and removing the plate.

By attraction of opposite charges between the conductive deformable crossbeams and the conductive structs, the conductive deformable crossbeams move relatively to the conductive structs gradually, so that the inner edges of the conductive deformable crossbeams drive the external edge of the deformable lens to be stretched in a radial direction and drive the deformable lens to rotate around an optical axis clockwise or anticlockwise. As a result, surface curvature of the deformable lens is changed and a focusing function is reached. The conductive deformable crossbeams are suspended in the air, and the external edges thereof are fixedly connected with the fixed parts and remain stationary. The conductive structs are fixedly connected with the fixed parts and remain stationary. The fixed parts may improve the stability and accuracy of focusing of the deformable lens, and provide convenience for the assembly of the MEMS based focusing device.

Optionally, the method may further include: before thinning the lower layer of the semiconductor substrate, depositing a dielectric layer on a side wall of the conductive deformable crossbeams and the conductive structs; and depositing a dielectric layer between any two adjacent fixed parts. In some embodiments, the dielectric layer may include silicon oxide, a high-K dielectric material or a low-K dielectric material. During an interattraction process between the conductive struct and the conductive deformable crossbeam, the dielectric layer may prevent wipeout of charges effectively.

Optionally, the semiconductor substrate may be a Silicon-On-Insulator (SOI) substrate. The upper layer of the semiconductor substrate may include a top silicon layer of the SOI substrate and the lower layer of the semiconductor substrate may include a buried layer and a bottom semiconductor layer of the SOI substrate. During a manufacturing process, the conductive deformable crossbeams and the conductive structs may be formed on the top silicon layer; and during the subsequent thinning process, the buried layer and the bottom semiconductor layer may be removed to release the conductive deformable crossbeams and the conductive structs, which may be convenient for controlling the processes. Besides, the SOI substrate may reduce parasitic capacitance.

Optionally, the method may further include: before thinning the lower layer of the semiconductor substrate, forming a metal interconnect and a pad on the conductive deformable crossbeams, the conductive structs or the fixed parts. The metal interconnect and the pad may play an effective role in providing charges to the conductive deformable crossbeams and the conductive structs or removing charges thereon.

Optionally, the method may further include: after removing the plate, forming an electric connection among the pad, an adjustable power supply device and a charge removing device in an external circuit through lead wires. Charge amount on the conductive deformable crossbeams and the conductive structs can be controlled by the one or more adjustable power supply devices, so that changes in curvature and the focal length of the deformable lens may be controlled accurately. When there is no need to change the focal length, charges on the conductive deformable crossbeams and the conductive structs may be removed, so that the deformable lens may be restorable.

Optionally, during the process of etching the upper layer of the semiconductor substrate by dry etching or wet etching to form the multiple groups of conductive deformable crossbeams and conductive structs and the one or more fixed parts, the multiple groups of conductive deformable crossbeams and the conductive structs may be symmetrically arranged around the circular groove. In some embodiments, the multiple groups of conductive deformable crossbeams and the conductive structs may be arranged around a circle of the circular groove and rotationally symmetric with respect to the circular groove. When rotationally stretching the deformable lens, the conductive deformable crossbeams and conductive structs in the rotationally symmetric arrangement enable every side of the deformable lens to share averaged force, which may prevent the deformable lens being damaged and keep the optical axis thereof unchanged.

Optionally, during the process of etching the upper layer of the semiconductor substrate by dry etching or wet etching to form the multiple groups of conductive deformable crossbeams and conductive structs and the one or more fixed parts, along a radial direction of the circular groove outwardly, a distance between the conductive deformable crossbeam and the conductive struct in each group may decrease gradually. During a process that the conductive struct attracts the conductive deformable crossbeam, an external part of the conductive deformable crossbeam nearest to the conductive struct may be attracted approaching the conductive struct or in contact with the conductive struct due to electrostatic attraction, and the deformable lens is somewhat rotationally stretched. Then, under a gradually increased electrostatic attraction force, an inner part of the conductive deformable crossbeam far away from the conductive struct may gradually approach the conductive struct, so that the deformable lens is further rotationally stretched. With such a structure in which a distance between the conductive deformable crossbeam and the conductive struct varies gradually, the conductive deformable crossbeam may be attracted under limited electric potential difference and the focal length of the deformable lens may be changed greatly.

Optionally, during the process of etching the upper layer of the semiconductor substrate by dry etching or wet etching to form the multiple groups of conductive deformable crossbeams and conductive structs and the one or more fixed parts, each of the conductive deformable crossbeams may take a shape of sickle which includes a bending part and a flat part. During a process that the conductive struct attracts the conductive deformable crossbeam, the bending part can rotationally stretch the deformable lens at utmost, so that curvature of the deformable lens is changed greatly.

Optionally, during the process of etching the upper layer of the semiconductor substrate by dry etching or wet etching to form the multiple groups of conductive deformable crossbeams and conductive structs and the one or more fixed parts, along a radial direction of the circular groove, each conductive deformable crossbeam has a flat side. Optionally, a cross section of the conductive deformable crossbeam may be a parallel tetrahedron structure which is long and narrow in a vertical direction and a process for manufacturing the conductive deformable crossbeam is simple.

Optionally, during the process of etching the upper layer of the semiconductor substrate by dry etching or wet etching to form the multiple groups of conductive deformable crossbeams and conductive structs and the one or more fixed parts, the conductive deformable crossbeams may include a plurality of first conductive deformable crossbeams and a plurality of second conductive deformable crossbeams, and the conductive structs may include a plurality of first conductive structs which correspond to the plurality of first conductive deformable crossbeams and a plurality of second conductive structs which correspond to the plurality of second conductive deformable crossbeams. The plurality of first conductive deformable crossbeams and the plurality of second conductive deformable crossbeams are arranged around the circular groove, and each first conductive deformable crossbeam and each second conductive deformable crossbeam are spaced from each other. The plurality of first conductive structs and the plurality of second conductive structs are arranged around the circular groove, and each first conductive struct and each second conductive struct are spaced from each other. In such, the conductive deformable crossbeam has opposite charges with one adjacent conductive struct and has like charges with the other adjacent conductive struct. Therefore, almost all the conductive structs attract their corresponding conductive deformable crossbeams disposed on a same side of them, which ensures the deformable lens to be rotationally stretched towards a same direction, and this is benefit to a change of the focal length and to the stability of the optical axis of the deformable lens.

Optionally, during the process of etching the upper layer of the semiconductor substrate by dry etching or wet etching to form the multiple groups of conductive deformable crossbeams and conductive structs and the one or more fixed parts, an angle between an inner side of the flat part of the conductive deformable crossbeam and an inner side of the conductive struct which are opposite in each group may range from 1° to 60°. Optionally, the angle between the inner side of the flat part of the conductive deformable crossbeam and the inner side of the conductive struct which are opposite in each group may range from 5° to 50°. The smaller the angle is, the less the deformable lens is rotationally stretched and the less the focal length is changed; and vice versa.

Optionally, a surface of the plate which is opposite to the circular groove may have a circular protrusion or a circular pit thereon. The circular protrusion or the circular pit may act as a mould which enables drops of the heated transparent plastic to form a circular protrusion or a circular pit having the same shape with the mould, so that an external surface of the deformable lens may be convex or concave. When the surface of the plate which is opposite to the circular groove has a circular protrusion thereon, the formed deformable lens may be concave; and when the surface of the plate which is opposite to the circular groove has a circular pit thereon, the formed deformable lens may be convex.

Optionally, forming the deformable lens in the circular groove may include: injecting drops of the heated transparent plastic into the circular groove; molding the heated transparent plastic on a surface of the semiconductor substrate after thinning by employing a casting module having a circular pit or a circular protrusion to form a deformable lens with a convex external surface or a concave external surface; fixedly connecting an external edge of the deformable lens with the inner edges of the conductive deformable crossbeams; and removing the casting module. When the casting module has a circular pit, an external surface of the formed deformable lens may be concave; and when the casting module has a circular protrusion, the external surface of the formed deformable lens may be convex. A required curvature of the external surface of the deformable lens may be obtained by employing a casting module.

Optionally, after thinning the lower layer of the semiconductor substrate, the MEMS based focusing device may have a thickness ranging from 1 μm to 1000 μm. In some embodiments, the MEMS based focusing device may have a thickness ranging from 10 μm to 100 μm. The smaller the thickness is, the smaller the size of the device is. A smaller size may be benefit to thermal radiation during the operation of the device.

DETAILED DESCRIPTION OF THE DISCLOSURE

Figure 1:
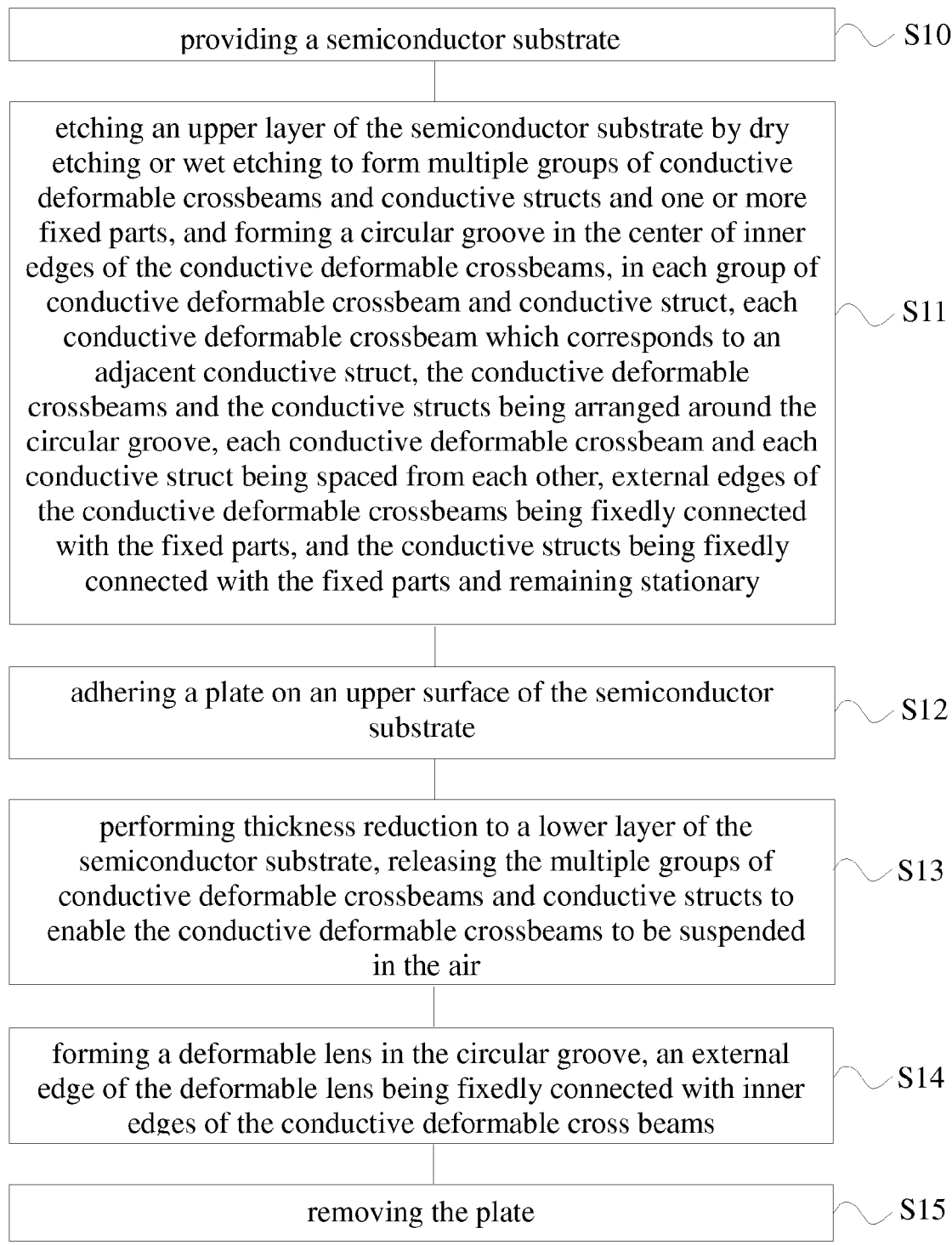
FIG. 1 schematically illustrates a flow chart of a method for manufacturing a MEMS based focusing device in the present disclosure.

In order to clarify the objects, characteristics and advantages of the disclosure, embodiments of present disclosure will be described in detail in conjunction with accompanying drawings.

In one embodiment of the present disclosure, an MEMS based focusing device is provided, including:
a deformable lens;
multiple groups of conductive deformable crossbeams and conductive structs, where in each group, each conductive deformable crossbeam corresponds to an adjacent conductive struct, the conductive deformable crossbeams and the conductive structs are arranged around the deformable lens, each conductive deformable crossbeam and each conductive struct are spaced from each other, the conductive deformable crossbeams are suspended in the air, and inner edges of the conductive deformable crossbeams are fixed connected with an external edge of the deformable lens; and
one or more fixed parts, where external edges of the conductive deformable crossbeams are fixedly connected with the fixed parts, and the conductive structs are fixedly connected with the fixed parts and remain stationary.

Electrostatic force between the conductive deformable crossbeam and the conductive struct in each group enables the conductive deformable crossbeam to move relatively to the conductive struct, so that the deformable lens is stretched and rotates around an optical axis of the deformable lens clockwise or anticlockwise. As a result, surface curvature and focal length of the deformable lens may be changed.

In some embodiments, the multiple groups of conductive deformable crossbeams and conductive structs are symmetrically arranged around the deformable lens with respect to the optical axis thereof. Along a radial direction of the deformable lens outwardly, a distance between the conductive deformable crossbeam and the conductive struct in each group may decrease gradually. Each of the conductive deformable crossbeams may take a shape of sickle which includes a bending part and a flat part. An inner edge of the bending part is fixedly connected with the external edge of the deformable lens.

In some embodiments, along a radial direction of the deformable lens, each conductive deformable crossbeam may be a parallelepiped.

In some embodiments, the conductive deformable crossbeams may include a plurality of first conductive deformable crossbeams and a plurality of second conductive deformable crossbeams, and the conductive structs may include a plurality of first conductive structs which correspond to the plurality of first conductive deformable crossbeams and a plurality of second conductive structs which correspond to the plurality of second conductive deformable crossbeams. The plurality of first conductive deformable crossbeams and the plurality of second conductive deformable crossbeams are arranged around the deformable lens, and each first conductive deformable crossbeam and each second conductive deformable crossbeam are spaced from each other. The plurality of first conductive structs and the plurality of second conductive structs are arranged around the deformable lens, and each first conductive struct and each second conductive struct are spaced from each other. When the conductive deformable crossbeam and the conductive struct in each group have opposite charges, the first conductive deformable crossbeam and the second conductive deformable crossbeam may have opposite charges, and the first conductive struct and the second conductive struct may have opposite charges.

In some embodiments, in each group of the conductive deformable crossbeam and the conductive struct, each conductive deformable crossbeam corresponds to one adjacent conductive struct. The conductive deformable crossbeams may include a plurality of first conductive deformable crossbeams and a plurality of second conductive deformable crossbeams, and the conductive structs may include a plurality of first conductive structs which correspond to the plurality of first conductive deformable crossbeams and a plurality of second conductive structs which correspond to the plurality of second conductive deformable crossbeams. The plurality of first conductive deformable crossbeams and the plurality of second conductive deformable crossbeams are arranged around a circle of the deformable lens, and each first conductive deformable crossbeam and each second conductive deformable crossbeam are spaced from each other. The plurality of first conductive structs and the plurality of second conductive structs are arranged around the circle of the deformable lens, and each first conductive struct and each second conductive struct are spaced from each other. When electrostatic repulsion occurs between the conductive deformable crossbeam and the conductive struct in each group, the first conductive deformable crossbeams and the second conductive deformable crossbeams may have opposite charges, and the first conductive structs and the second conductive structs may have opposite charges. In some embodiments, an inner side of the flat part of the conductive deformable crossbeam may be parallel with an inner side of the conductive struct which is opposite to the inner side of the flat part. When electrostatic repulsion occurs between the conductive deformable crossbeam and the conductive struct, a distance therebetween may be increased.

In some embodiments, in each group of the conductive deformable crossbeam and the conductive struct, each conductive deformable crossbeam corresponds to two adjacent conductive structs which are disposed on two sides of the corresponding conductive deformable crossbeam. The conductive deformable crossbeams may include a plurality of first conductive deformable crossbeams and a plurality of second conductive deformable crossbeams, and the conductive structs may include a plurality of first conductive structs and a plurality of third conductive structs which correspond to the plurality of first conductive deformable crossbeams and a plurality of second conductive structs and a plurality of fourth conductive structs which correspond to the plurality of second conductive deformable crossbeams. The plurality of first conductive deformable crossbeams and the plurality of second conductive deformable crossbeams are arranged around a circle of the deformable lens, and each first conductive deformable crossbeam and each second conductive deformable crossbeam are spaced from each other. The plurality of first conductive structs and the plurality of second conductive structs are arranged around the circle of the deformable lens, and each first conductive struct and each second conductive struct are spaced from each other. The plurality of third conductive structs and the plurality of fourth conductive structs are arranged around the circle of the deformable lens, and each third conductive struct and each fourth conductive struct are spaced from each other. When electrostatic attraction occurs between the conductive deformable crossbeam and one adjacent conductive struct, and electrostatic repulsion occurs between the conductive deformable crossbeam and the other adjacent conductive struct in each group, the first conductive deformable crossbeams and the second conductive deformable crossbeams may have opposite charges, the first conductive structs and the second conductive structs may have opposite charges, and the third conductive structs and the fourth conductive structs may have opposite charges. Optionally, in each group, an angle may be formed between an inner side of the flat part of the conductive deformable crossbeam and an inner side of one adjacent conductive struct which are opposite, and the flat part may be parallel with an inner side of the other adjacent conductive struct which is opposite to the flat part. When electrostatic attraction occurs between the conductive deformable crossbeam and one adjacent conductive struct, a distance therebetween may decrease, electrostatic repulsion may occur between the conductive deformable crossbeam and the other adjacent conductive struct, and a distance between the conductive deformable crossbeam and the other adjacent conductive struct may be increased.

In above embodiments, an angle is formed between an inner side of the flat part of the conductive deformable crossbeam and an inner side of the conductive struct which are opposite in each group. When electrostatic attraction occurs between the conductive deformable crossbeam and the conductive struct, a distance therebetween may decrease. The angle between the inner side of the flat part of the conductive deformable crossbeam and the inner side of the conductive struct which are opposite in each group may range from 1° to 60°, preferably from 5° to 50°. It is well known to those skilled in the art that, the greater the number of groups of the conductive deformable crossbeams and the conductive structs is, the smaller the angle is.

In some embodiments, an external surface of the deformable lens may be convex or concave. The deformable lens may include transparent plastic. The conductive deformable crossbeams, the conductive structs and the fixed parts may include silicon. The fixed parts are fixedly connected with each other by silicon dioxide. In some embodiments, the fixed parts may include silicon dioxide.

In some embodiments, the focusing device may have a thickness ranging from 1 μm to 1000 μm. In some embodiments, the focusing device may have a thickness ranging from 10 μm to 100 μm.

In some embodiments, the focusing device may include one or more adjustable power supply devices and one or more charge removing devices. The one or more adjustable power supply devices may be configured to provide charges to the conductive deformable crossbeams and the conductive structs. The one or more charge removing devices may be configured to remove charges on the conductive deformable crossbeams and the conductive structs.

In one embodiment of the present disclosure, a method for manufacturing an MEMS based focusing device is provided, including:

S10, providing a semiconductor substrate;

S11, etching an upper layer of the semiconductor substrate by dry etching or wet etching to form multiple groups of conductive deformable crossbeams and conductive structs and one or more fixed parts, and forming a circular groove in the center of inner edges of the conductive deformable crossbeams, where in each group of conductive deformable crossbeam and conductive struct, each conductive deformable crossbeam corresponds to an adjacent conductive struct, the conductive deformable crossbeams and the conductive structs are arranged around the circular groove, each conductive deformable crossbeam and each conductive struct are spaced from each other, external edges of the conductive deformable crossbeams are fixedly connected with the fixed parts, and the conductive structs are fixedly connected with the fixed parts and remain stationary;

S12, adhering a plate on an upper surface of the semiconductor substrate;

S13, thinning a lower layer of the semiconductor substrate, releasing the multiple groups of conductive deformable crossbeams and conductive structs to make the conductive deformable crossbeams suspended in the air;

S14, forming a deformable lens in the circular groove, an external edge of the deformable lens being fixedly connected with inner edges of the conductive deformable cross beams; and S15, removing the plate.

In one embodiment, the method for manufacturing an MEMS based focusing device may include:

providing a SOI substrate, the SOI substrate including a bottom semiconductor layer, a buried layer and a top silicon layer from bottom to top;

etching the top silicon layer by dry etching or wet etching to form multiple groups of conductive deformable crossbeams and conductive structs and a plurality of fixed parts, and forming a circular groove in the center of inner edges of the conductive deformable crossbeams, where in each group of conductive deformable crossbeam and conductive struct, each conductive deformable crossbeam corresponds to an adjacent conductive struct, the conductive deformable crossbeams and the conductive structs are arranged around the circular groove, each conductive deformable crossbeam and each conductive struct are spaced from each other, the multiple groups of conductive deformable crossbeams and the conductive structs are symmetrically arranged around the circular groove, along a radial direction of the circular groove outwardly, a distance between the conductive deformable crossbeam and the conductive struct in each group may decrease gradually, each of the conductive deformable crossbeams may take a shape of sickle which includes a bending part and a flat part, an angle between an inner side of the flat part of the conductive deformable crossbeam and an inner side of the conductive struct which are opposite in each group may range from 1° to 60°, preferably from 5° to 50°, external edges of the conductive deformable crossbeams are fixedly connected with the fixed parts, and the conductive structs are fixedly connected with the fixed parts and remain stationary;

forming a groove between the adjacent fixed parts by an etching process;

depositing a dielectric layer including silicon oxide on the top silicon layer, coating a photoresist layer on the dielectric layer and performing an etching process on the photoresist layer, where silicon oxide on a side wall of the conductive deformable crossbeams and the conductive structs, and silicon oxide between the adjacent fixed parts are remained;

forming a metal interconnect and a pad on the conductive deformable crossbeams, the conductive structs and the fixed parts;

adhering a glass plate on an upper surface of the conductive deformable crossbeams and the conductive structs, where a surface of the glass plate which is opposite to the circular groove has a circular protrusion or a circular pit thereon, another surface of the glass plate is flat;

removing the bottom semiconductor layer and the buried layer and releasing the multiple groups of conductive deformable crossbeams and conductive structs to enable the conductive deformable crossbeams to be suspended in the air and enable the MEMS based focusing device to have a thickness ranging from 1 μm to 1000 μm, preferably from 10 μm to 100 μm;

injecting drops of heated transparent plastic into the circular groove, molding the heated transparent plastic on a lower surface of the top silicon layer by employing a casting module having a circular pit or a circular protrusion to form a deformable lens with a convex external surface or a concave external surface; fixedly connecting an external edge of the deformable lens with the inner edges of the conductive deformable crossbeams, and removing the casting module; and removing the glass plate, and forming an electric connection among the pad, an adjustable power supply device and a charge removing device in an external circuit through lead wires.

In some embodiments, for brevity, the deformable lens is illustrated as a circle and the optical axis thereof is disposed on the center of the circle. In vertical views in embodiments of the present disclosure, a direction of the optical axis of the deformable lens may be perpendicular to a plane of the paper and pass through the center of the circle. It should be noted that, in other embodiments, a vertical view of the deformable lens may be not a circle but an ellipse or any combinational shape of a circle and an ellipse. The optical axis of the deformable lens may be not exactly perpendicular to the plane of the paper but angularly offset relative to an axis perpendicular to the plane of the paper. The following embodiments may be used to explain the present disclosure but not used to limit the scope of the present disclosure.

Figure 2:
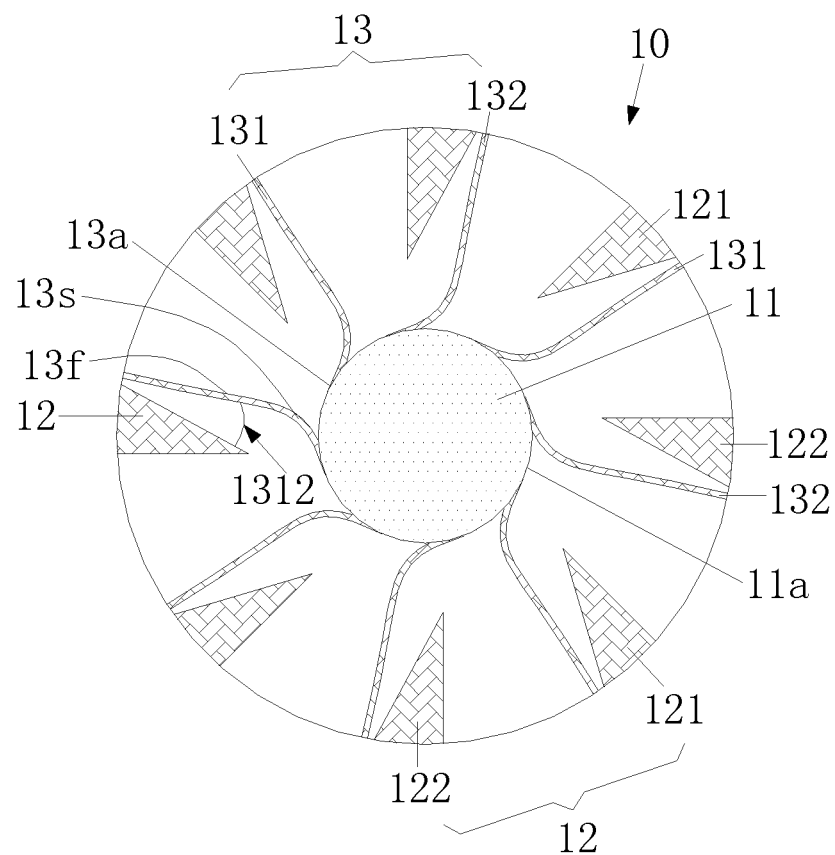
FIG. 2 schematically illustrates a vertical view of a MEMS based focusing device according to a first embodiment of the present disclosure.

FIG. 2 schematically illustrates a vertical view of a MEMS based focusing device according to a first embodiment of the present disclosure. As shown in FIG. 2, the MEMS based focusing device 10 may include a deformable lens 11, a plurality of conductive deformable crossbeams 13 and a plurality of conductive structs 12 which correspond to the plurality of conductive deformable crossbeams 13. The conductive deformable crossbeams 13 and the conductive structs 12 are arranged around a circle of the deformable lens 11, and each conductive deformable crossbeam and each conductive struct are spaced from each other. The conductive deformable crossbeams 13 may be suspended in the air. Inner edges 13a of the conductive deformable crossbeams 13 are fixedly connected with an external edge 11a of the deformable lens 11. When the conductive deformable crossbeams 13 and the conductive structs 12 have opposite charges, electrostatic attraction may occur, so that the conductive deformable crossbeams 13 may bend relative to the conductive structs 12 and the deformable lens 11 is rotationally stretched and rotate anticlockwise. In such, surface curvature and a focal length of the deformable lens 11 may be changed. In a practical automatic focusing process, how much the deformable lens 11 is rotationally stretched may be controlled by the number of charges on the conductive deformable crossbeams 13 and the conductive structs 12 which are provided by an adjustable power supply device.

As shown in FIG. 2, the conductive deformable crossbeams 13 include first conductive deformable crossbeams 131 and second conductive deformable crossbeams 132, and the conductive structs 12 include first conductive structs 121 which correspond to the first conductive deformable crossbeams 131 and second conductive structs 122 which correspond to the second conductive deformable crossbeams 132. When the conductive deformable crossbeams 13 and the conductive structs 12 have opposite charges, for example, the first conductive structs 121 and the second conductive deformable crossbeams 132 carry positive charges while the second conductive structs 122 and the first conductive deformable crossbeams 131 carry negative charges, the first and second conductive deformable crossbeams carry opposite charges, the first and second conductive structs carry opposite charges, and the first conductive deformable crossbeams 131 and the adjacent second conductive structs 122 carry like charges. Therefore, in an electrostatic attraction process, the first conductive deformable crossbeams 131 and the corresponding first conductive structs 121 may attract each other while the first conductive deformable crossbeams 131 and the second conductive structs 122 may not attract each other. In such, almost all the conductive deformable crossbeams 13 and the corresponding conductive structs 12 attract each other, which ensures the deformable lens 11 to be rotationally stretched towards a same direction. In other embodiments, all the conductive structs 12 may have like charges, all the conductive deformable crossbeams 13 may have like charges, and the conductive structs 12 and the conductive deformable crossbeams 13 have opposite charges. As shown in FIG. 2, in some embodiments, the eight conductive deformable crossbeams and the eight conductive structs are arranged around a deformable lens 11 and rotationally symmetric with respect to an optical axis of the deformable lens 11. It is known to those skilled in the art that, in other embodiments, other even numbers of conductive deformable crossbeams and conductive structs may be arranged around the deformable lens 11 and rotationally symmetric with respect to the optical axis of the deformable lens 11.

By employing an adjustable power supply device to control charge amount on the conductive deformable crossbeams and the conductive structs or employing a charge removing device to remove charges thereon, the deformable lens may rotationally contract, so that surface curvature and the focal length thereof may be changed. Specifically, under the action of the adjustable power supply device and the charge removing device, the conductive deformable crossbeams may bend and then an elastic restoring force may be generated. Under the elastic restoring force, the deformable lens may be driven to move towards a direction opposite to the bending direction of the conductive deformable crossbeams, that is, the deformable lens rotationally contracts clockwise, so that surface curvature and the focal length of the deformable lens may be changed.

As shown in FIG. 2, each conductive deformable crossbeam 13 takes a shape of sickle which includes a bending part 13s and a flat part 13f. The bending part 13s is fixedly connected with external edges 11a of the deformable lens 11. An angle 1312 between an inner side of the flat part 13f of each conductive deformable crossbeam 13 and an inner side of a conductive struct 12 which are opposite is 20°. Along a radial direction of the deformable lens 11 outwardly, a distance between the conductive deformable crossbeam 13 and the conductive struct 12 in each group may decrease gradually.

In other embodiments, the angle 1312 between the inner side of the flat part 13f of each conductive deformable crossbeam 13 and the inner side of the conductive struct 12 which are opposite may range from 1° to 60°, for example, 5°, 15°, 20°, 30°, 40°, 50°, 55°, preferably from 5° to 50°, but the angle is not limited to these values.

In some embodiments, the deformable lens 11 may include plastic, and the conductive deformable crossbeams 13 and the conductive structs 12 may include silicon. In other embodiments, the conductive deformable crossbeams 13 and the conductive structs 12 may include other semiconductor materials, such as germanium, a doped semiconductor material, a semiconductor material of binary compound or a semiconductor material of ternary compound. A dielectric layer may be formed on a side wall of the conductive deformable crossbeam 13 and the conductive struct 12 in each group.

Figure 3:
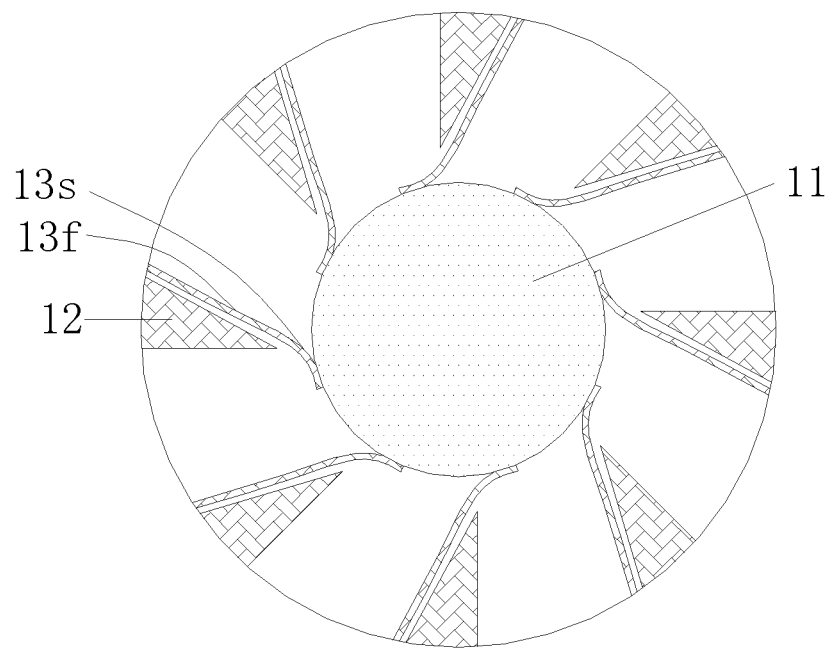
FIG. 3 schematically illustrates a vertical view of a focal length change of a deformable lens in the MEMS based focusing device shown in FIG. 2.

FIG. 3 schematically illustrates a vertical view of a focal length change of a deformable lens in the MEMS based focusing device shown in FIG. 2. When opposite charges are provided for the conductive deformable crossbeams 13 and the conductive structs 12 by the adjustable power supply device, the flat part 13f of each conductive deformable crossbeam 13 is nearest to the conductive struct 12, thus, a portion of the flat part 13f which is away from the deformable lens 11 may be attracted by the conductive struct 12 first. A distance between the intersection of the flat part 13f and the bending part 13s and the conductive struct 12 decreases gradually and the whole conductive deformable crossbeam 13 is attracted by the conductive struct 12 entirely at last, thus, a change in the focal length of the deformable lens 11 may be maximum. Therefore, in the embodiments in the present disclosure, although the conductive deformable crossbeams 13 and the conductive structs 12 have relatively few charges, the change in the focal length of the deformable lens 11 can be maximized, thereby reducing power consumption. Referring to FIGS. 2 and 3, after the deformable lens 11 is rotationally stretched anticlockwise, curvature thereof is changed. Accordingly, the focal length thereof is changed.

Figure 4:
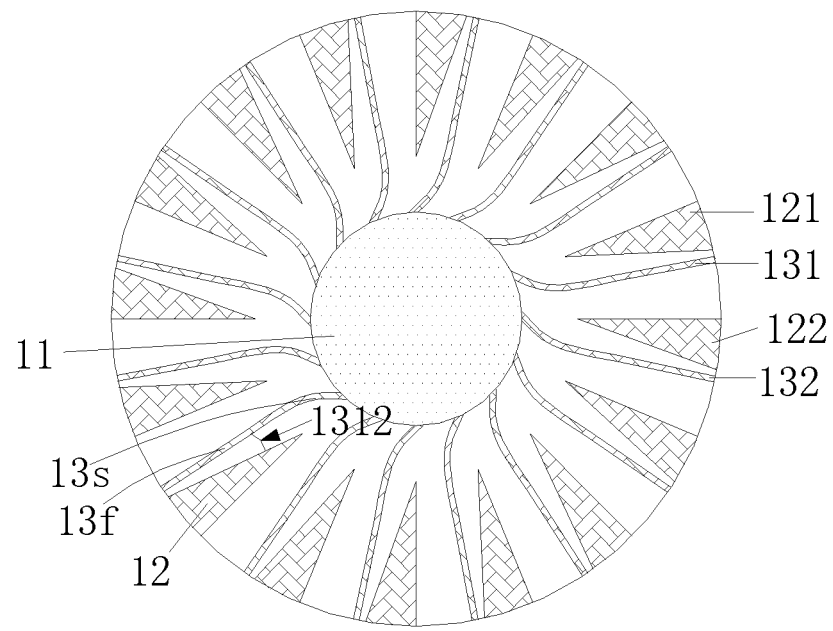
FIG. 4 schematically illustrates a vertical view of a MEMS based focusing device according to a second embodiment of the present disclosure.

FIG. 4 schematically illustrates a vertical view of a MEMS based focusing device according to a second embodiment of the present disclosure. The second embodiment is almost the same with the first embodiment. The only difference between the first embodiment and the second embodiment is that, in the second embodiment, the MEMS based focusing device includes eight first conductive deformable crossbeams 131, eight second conductive deformable crossbeams 132, eight first conductive structs 121 and eight second conductive structs 122. An angle 1312 between an inner side of a flat part 13f of each conductive deformable crossbeam 13 and an inner side of a conductive struct 12 which are opposite is 10°.

Figure 5:
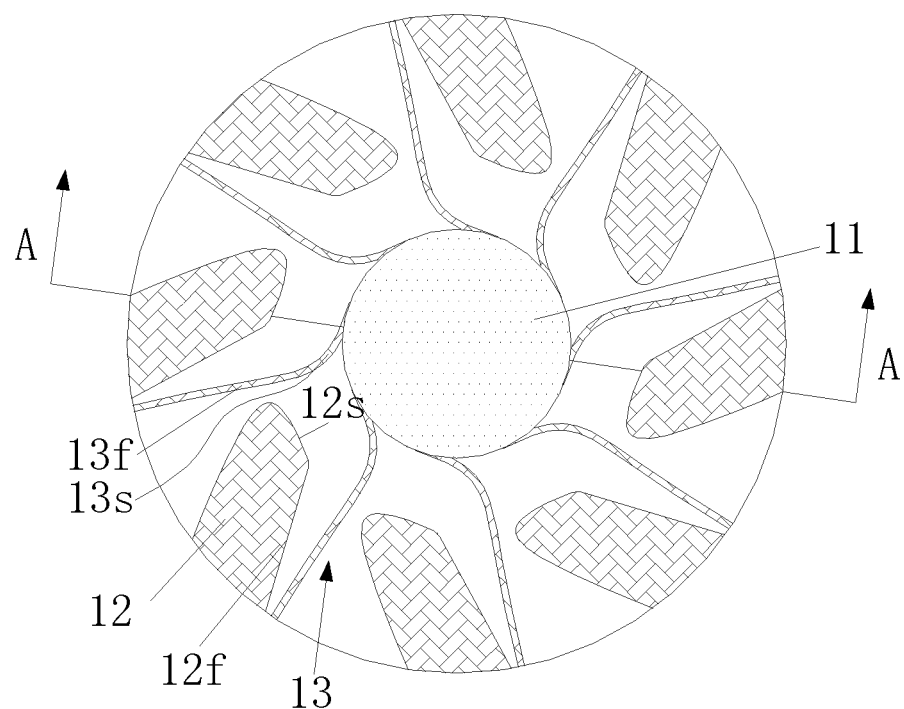
FIG. 5 schematically illustrates a vertical view of a MEMS based focusing device according to a third embodiment of the present disclosure.

FIG. 5 schematically illustrates a vertical view of a MEMS based focusing device according to a third embodiment of the present disclosure. The third embodiment is almost the same with the first embodiment. Differences between the first embodiment and the third embodiment are described as follows. In the third embodiment, in each group of the conductive deformable crossbeam 13 and the conductive struct 12, the conductive deformable crossbeam 13 is disposed on the right of the conductive struct 12 which corresponds to the conductive deformable crossbeam 13. When the conductive deformable crossbeam 13 and the corresponding conductive struct 12 have opposite charges, all the conductive deformable crossbeams 13 and the deformable lens 11 are rotationally stretched clockwise with respect to the optical axis of the deformable lens 11 at a same time. An inner side of the conductive struct 12 which is opposite to the conductive deformable crossbeam 13 includes a flat surface 12f and a bending part 12s, edges of which take a shape of sickle similar to the shape of the conductive deformable crossbeam 13. Therefore, when the conductive deformable crossbeam 13 is attracted by the conductive struct 12 to rotationally stretch the deformable lens 11, the bending part 13s may be attracted by the bending part 12s more stably, so that the focal length of the deformable lens may be a stable predetermined value.

Figure 6:
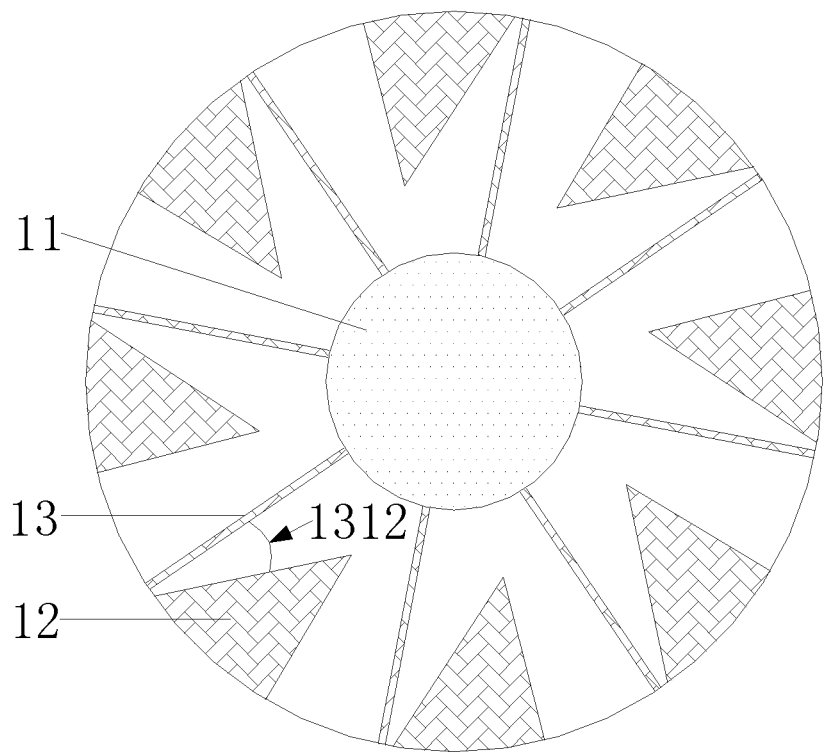
FIG. 6 schematically illustrates a vertical view of a MEMS based focusing device according to a fourth embodiment of the present disclosure.

FIG. 6 schematically illustrates a vertical view of a MEMS based focusing device according to a fourth embodiment of the present disclosure. The fourth embodiment is almost the same with the first embodiment. Differences between the first embodiment and the fourth embodiment are described as follows. Along a radial direction of the deformable lens 11, each conductive deformable crossbeam 13 has a flat side, and an angle 1312 between an inner side of each conductive deformable crossbeam 13 and an inner side of a conductive struct 12 which are opposite is 30°.

Figure 7:
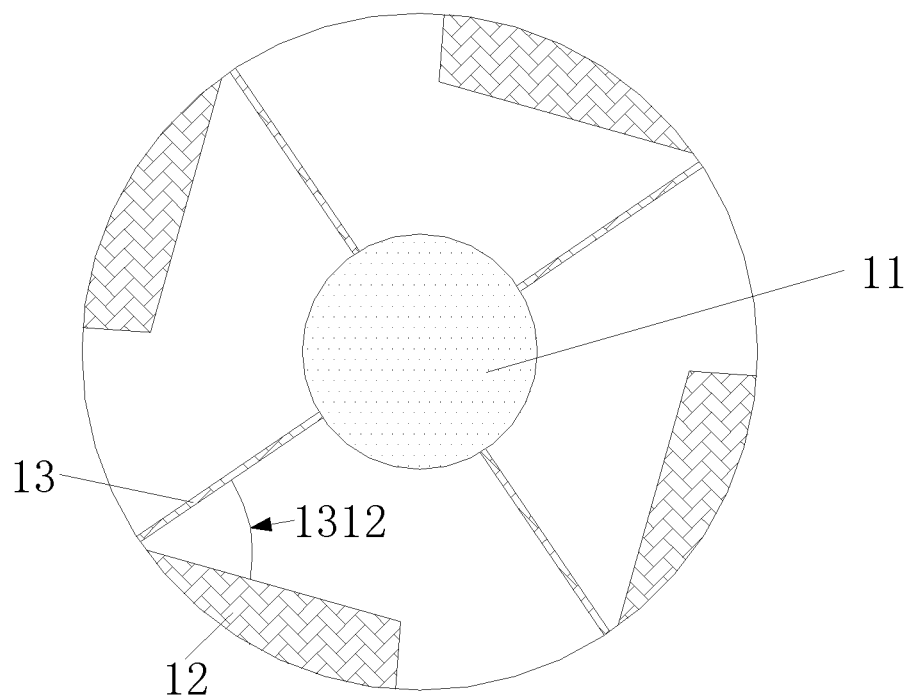
FIG. 7 schematically illustrates a vertical view of a MEMS based focusing device according to a fifth embodiment of the present disclosure.

FIG. 7 schematically illustrates a vertical view of a MEMS based focusing device according to a fifth embodiment of the present disclosure. The fifth embodiment is almost the same with the first embodiment. Differences between the first embodiment and the fifth embodiment are described as follows. In the fifth embodiment, the MEMS based focusing device includes four conductive deformable crossbeams 13 and four conductive structs 12. Each conductive deformable crossbeam 13 has a flat side, and an angle 1312 between an inner side of each conductive deformable crossbeam 13 and an inner side of a conductive struct 12 which are opposite is 60°.

Figure 8:
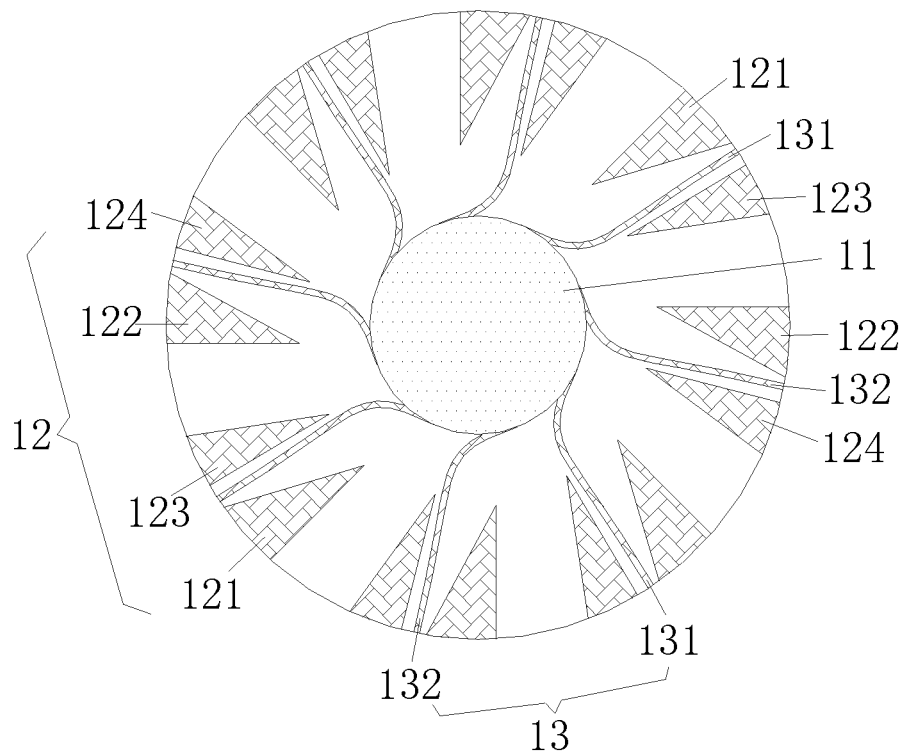
FIG. 8 schematically illustrates a vertical view of a MEMS based focusing device according to a sixth embodiment of the present disclosure.

FIG. 8 schematically illustrates a vertical view of a MEMS based focusing device according to a sixth embodiment of the present disclosure. The sixth embodiment is almost the same with the first embodiment. Differences between the first embodiment and the sixth embodiment are described as follows. In the sixth embodiment, each conductive deformable crossbeam 13 may include a first conductive deformable crossbeam 131 and a second conductive deformable crossbeam 132, and each conductive struct 12 may include a first conductive struct 121, a second conductive struct 122, a third conductive struct 123 and a fourth conductive struct 124. The first conductive deformable crossbeam 131 correspond to the first conductive struct 121 and the third conductive struct 123 which are arranged on two sides of the first conductive deformable crossbeam 131 respectively. An angle may be formed between an inner side of a flat part of the conductive deformable crossbeam 131 and an inner side of the conductive struct 121 which are opposite. The flat part of the conductive deformable crossbeam 131 is parallel with an inner side of the conductive struct 123 which is opposite to the flat part. The second conductive deformable crossbeam 132 correspond to the second conductive struct 122 and the fourth conductive struct 124 which are arranged on two sides of the second conductive deformable crossbeam 132 respectively. An angle may be formed between an inner side of a flat part of the conductive deformable crossbeam 132 and an inner side of the conductive struct 122 which are opposite. The flat part of the conductive deformable crossbeam 132 is parallel with an inner side of the conductive struct 124 which is opposite to the flat part. The first conductive structs 121 and the second conductive structs 122 are arranged around the deformable lens 11, and each first conductive struct 121 and each second conductive struct 122 are spaced from each other. The third conductive structs 123 and the fourth conductive structs 124 are arranged around the deformable lens 11, and each third conductive struct 123 and each fourth conductive struct 124 are spaced from each other. The first conductive deformable crossbeams 131 and the second conductive deformable crossbeams 132 are arranged around the deformable lens 11, and each first conductive deformable crossbeam 131 and each second conductive deformable crossbeam 132 are spaced from each other. When the first conductive deformable crossbeams 131 carry negative charges, the first conductive structs 121, the second conductive deformable crossbeams 132 and the fourth conductive structs 124 may carry positive charges, and the third conductive structs 123 and the second conductive structs 122 may carry negative charges. Thus, under electrostatic attraction and electrostatic repulsion between the conductive structs and the conductive deformable crossbeams, a distance between the first conductive deformable crossbeams 131 and the first conductive structs 121 may decrease, a distance between the first conductive deformable crossbeams 131 and the third conductive structs 123 may be increased, a distance between the second conductive deformable crossbeams 132 and the second conductive structs 122 may decrease, and a distance between the second conductive deformable crossbeams 132 and the fourth conductive structs 124 may be increased. The deformable lens 11 may be rotationally stretched through the movement of the conductive deformable crossbeams, thereby the focal length thereof may be changed.

In some embodiments, the first conductive deformable crossbeams 131 and the second conductive deformable crossbeams 132 may carry negative charges, the first conductive structs 121 and the second conductive structs 122 may carry positive charges, and the third conductive structs 123 and the fourth conductive structs 124 may carry negative charges. It is known to those skilled in the art that, in some embodiments, the first conductive deformable crossbeams 131 and the second conductive deformable crossbeams 132 may carry positive charges, the first conductive structs 121 and the second conductive structs 122 may carry negative charges, and the third conductive structs 123 and the fourth conductive structs 124 may carry positive charges.

Figure 9:
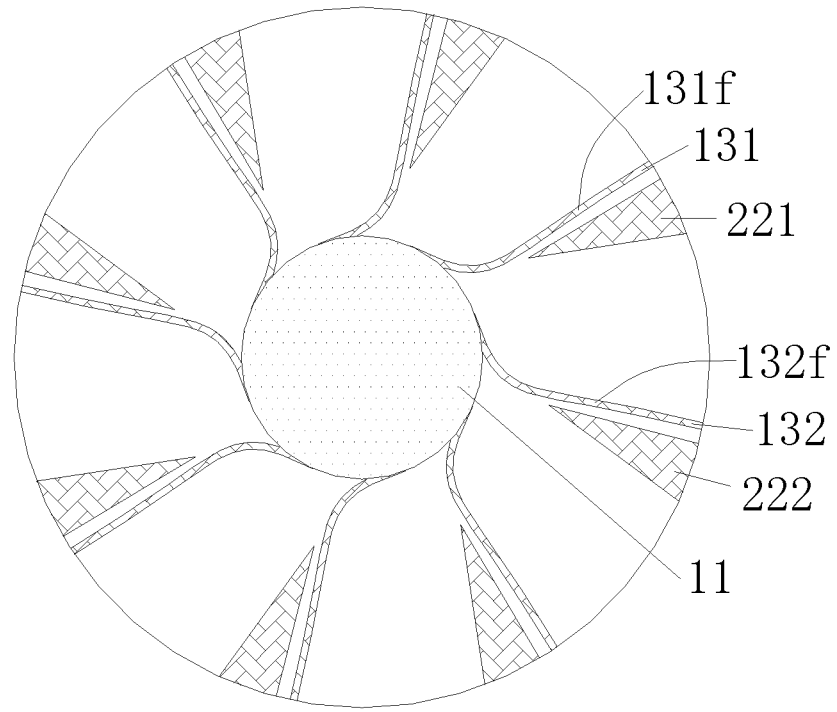
FIG. 9 schematically illustrates a vertical view of a MEMS based focusing device according to a seventh embodiment of the present disclosure.

FIG. 9 schematically illustrates a vertical view of a MEMS based focusing device according to a seventh embodiment of the present disclosure. The seventh embodiment is almost the same with the first embodiment. Differences between the first embodiment and the seventh embodiment are described as follows. In the seventh embodiment, a flat part 131f of a first conductive deformable crossbeam 131 is parallel with an inner side of a first conductive struct 221 which is opposite to the flat part 131f and a flat part 132f of a second conductive deformable crossbeam 132 is parallel with an inner side of a second conductive struct 222 which is opposite to the flat part 132f. When the first conductive deformable crossbeams 131 carry negative charges, the first conductive structs 221 may carry negative charges, and the second conductive deformable crossbeams 132 and the second conductive structs 222 may carry positive charges. Thus, under electrostatic repulsion, a distance between the first conductive deformable crossbeam 131 and the first conductive structs 221 may be increased, and a distance between the second conductive deformable crossbeam 132 and the second conductive structs 222 may be increased. The deformable lens 11 may be rotationally stretched through the movement of the conductive deformable crossbeams, thereby the focal length thereof may be changed. In other embodiments, when the first conductive deformable crossbeams 131 carry positive charges, the first conductive structs 221 may carry positive charges, and the second conductive deformable crossbeams 132 and the second conductive structs 222 may carry negative charges.

Figure 10:
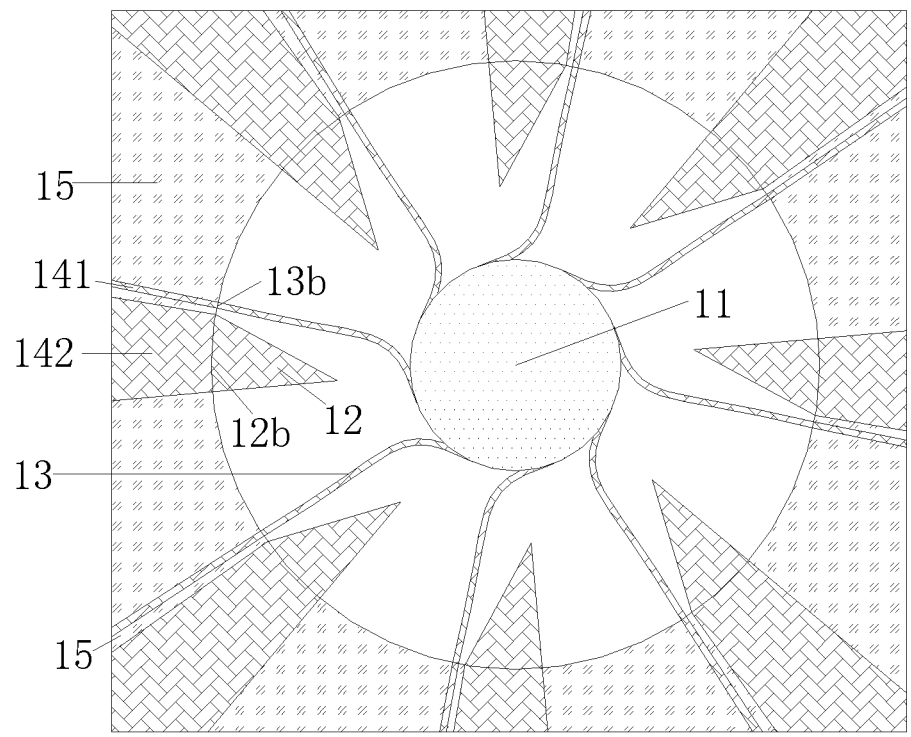
FIG. 10 schematically illustrates a vertical view of conductive deformable crossbeams and conductive structs fixedly connected with fixed parts in the MEMS based focusing device according to the first embodiment of the present disclosure.

FIG. 10 schematically illustrates a vertical view of conductive deformable crossbeams and conductive structs fixedly connected with fixed parts in the MEMS based focusing device according to the first embodiment of the present disclosure. As shown in FIG. 10, external edges 13b of conductive deformable crossbeams 13 may be fixedly connected with fixed parts 141, and external edges 12b of conductive structs 12 may be fixedly connected with fixed parts 142. A dielectric layer 15, having silicon dioxide, may be disposed between the fixed parts 141 and 142 to adhere the fixed parts 141 with the fixed parts 142, so that the conductive deformable crossbeams 13 and the conductive structs 12 may keep a stable distance relative to each other. In such, a change of an optical axis or a focal length of a deformable lens resulted from a change of the relative distance between the conductive deformable crossbeams 13 and the conductive structs 12 may be avoided.

Figure 11:
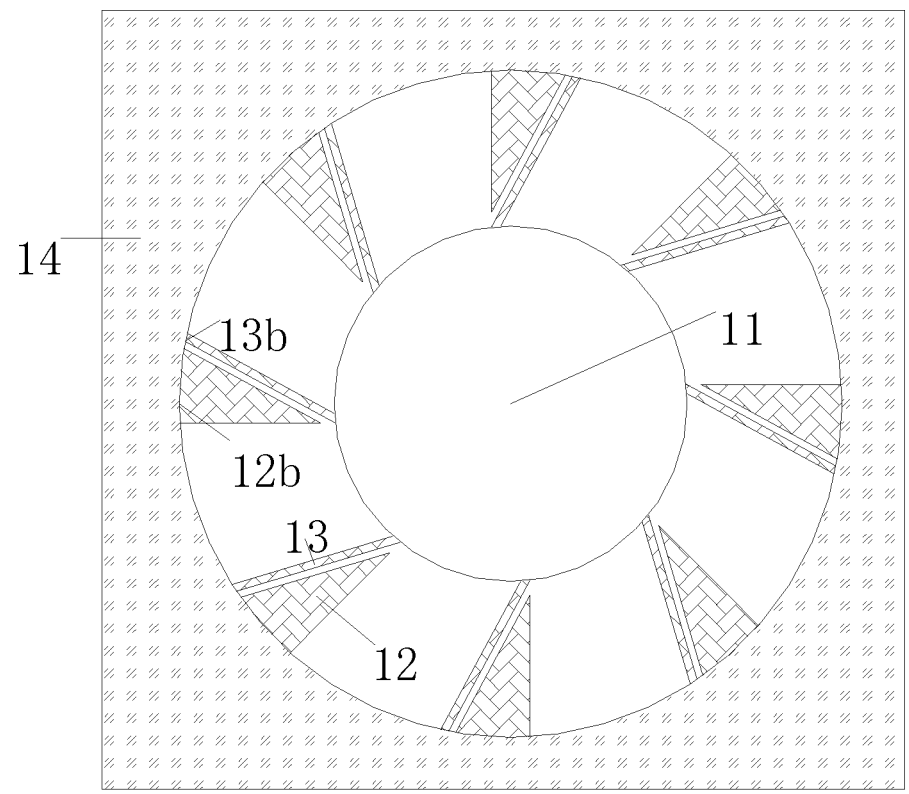
FIG. 11 schematically illustrates a vertical view of conductive deformable crossbeams and conductive structs fixedly connected with fixed parts in the MEMS based focusing device according to the fourth embodiment of the present disclosure.

FIG. 11 schematically illustrates a vertical view of conductive deformable crossbeams and conductive structs fixedly connected with fixed parts in the MEMS based focusing device according to the fourth embodiment of the present disclosure. As shown in FIG. 11, external edges 13b of conductive deformable crossbeams 13 may be fixedly connected with a fixed part 14, and external edges 12b of conductive structs 12 may be fixedly connected with the fixed part 14 as well. The fixed part 14 may be a dielectric layer including silicon dioxide. The conductive deformable crossbeams 13 and the conductive structs 12 are fixedly connected with each other through the same fixed part 14, so that the conductive deformable crossbeams 13 and the conductive structs 12 become an integral structure.

It is known to those skilled in the art, in some embodiment, when the fixed part 14 includes silicon, an interconnect and a pad which are electrically connected with the conductive deformable crossbeams 13 may be disposed on the fixed part 14 or on the conductive deformable crossbeams 13, and an interconnect and a pad which are electrically connected with the conductive structs 12 may be disposed on the fixed part 14 or on the conductive structs 12.

Figure 12:
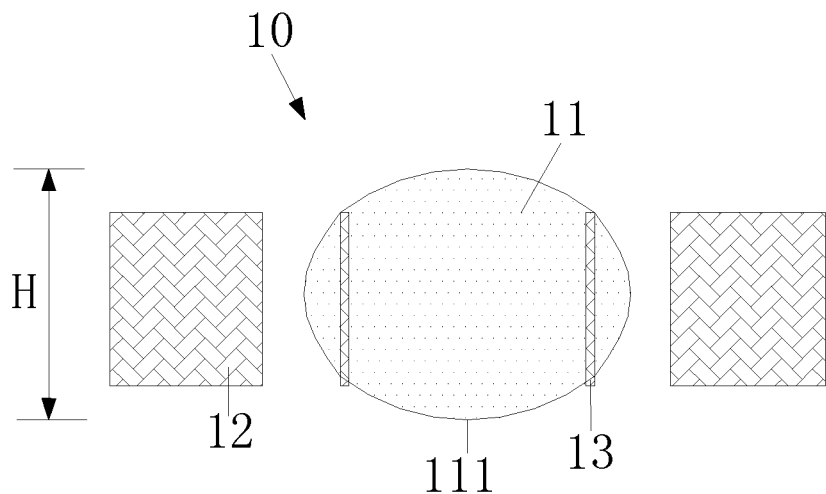
FIG. 12 schematically illustrates a sectional view of the MEMS based focusing device along an A-A line shown in FIG. 5 according to one embodiment of the present disclosure.

FIG. 12 schematically illustrates a sectional view of the MEMS based focusing device along an A-A line shown in FIG. 5 according to one embodiment of the present disclosure. As shown in FIG. 12, an MEMS based focusing device 10 has a thickness H of 100 μm. An external surface 111 of a deformable lens 11 is convex. The deformable lens 11 is fixedly connected with conductive deformable crossbeams 13. In some embodiments, the MEMS based focusing device 10 may have a thickness H of 50 μm.

Figure 13:
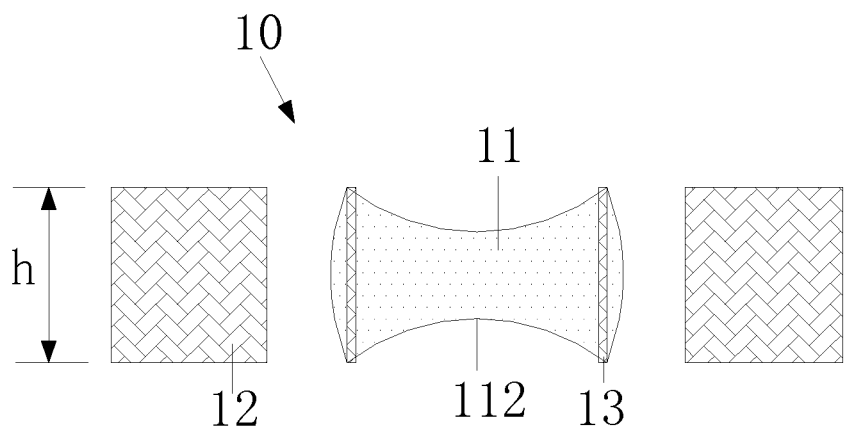
FIGS. 13 and 14 schematically illustrate sectional views of the MEMS based focusing device along an A-A line shown in FIG. 5 according to one embodiment of the present disclosure.
Figure 14:
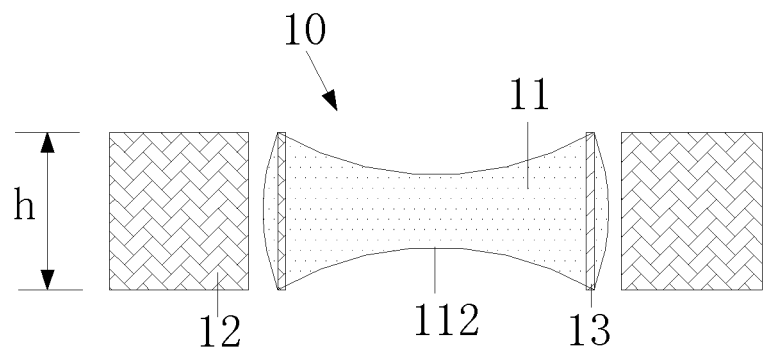

FIGS. 13 and 14 schematically illustrate sectional views of the MEMS based focusing device along an A-A line shown in FIG. 5 according to one embodiment of the present disclosure. As shown in FIG. 13, an MEMS based focusing device 10 has a thickness h of 10 μm. An external surface 112 of a deformable lens 11 is concave. The deformable lens 11 is fixedly connected with conductive deformable crossbeams 13. When conductive structs 12 and the conductive deformable crossbeams 13 carry opposite charges, the conductive deformable crossbeams 13 and the deformable lens 11 are rotationally stretched clockwise or anticlockwise around an optical axis of the deformable lens 11. Referring to FIG. 14, the conductive deformable crossbeams 13 stretch the deformable lens 11 on two ends of the deformable lens 11, respectively, so as to change curvature of the deformable lens 11 and further to change a focal length thereof. By controlling charge amount on the conductive deformable crossbeams 13 and the conductive structs 12, a curvature variation of the deformable lens 11 may be adjusted, and further a focal length variation thereof may be adjusted.

In other embodiments, a thickness of the MEMS based focusing device may range from 1 μm to 1000 μm, preferably from 10 μm to 100 μm. In practice, the MEMS based focusing device may have a required thickness through a polishing process or a chemical mechanical planarization process.

Thereafter, a method for manufacturing an MEMS based focusing device is described in detail in conjunction with accompanying drawings.

Figure 15:
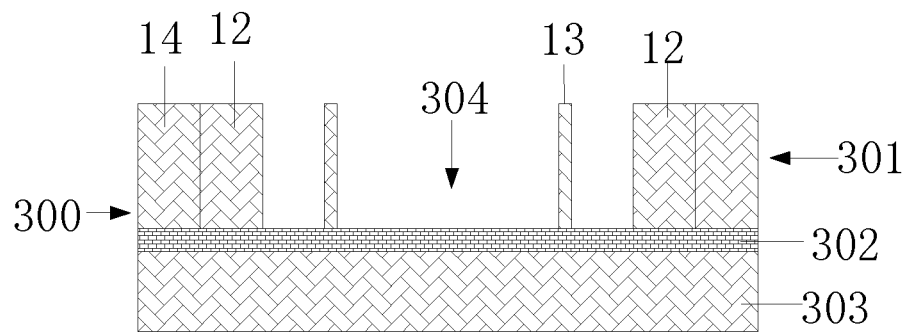
FIGS. 15 to 20 schematically illustrate sectional views of intermediate structures of a method for manufacturing a MEMS based focusing device according to one embodiment of the present disclosure.

FIGS. 15 to 20 schematically illustrate sectional views of intermediate structures of a method for manufacturing an MEMS based focusing device according to one embodiment of the present disclosure. As shown in FIG. 15, a SOI substrate 300 is provided, which includes a top silicon layer 301, a buried layer 302 and a bottom silicon layer 303 from top to bottom. The top silicon layer 301 is etched by dry etching or wet etching to form multiple groups of conductive deformable crossbeams 13 and conductive structs 12 and a plurality of fixed parts 14. A circular groove 304 is formed in the center of inner edges of the conductive deformable crossbeams 13. In each group of the conductive deformable crossbeam 13 and the conductive struct 12, each conductive deformable crossbeam 13 corresponds to an adjacent conductive struct 12, the conductive deformable crossbeams 13 and the conductive structs 12 are symmetrically arranged around the circular groove 304, each conductive deformable crossbeam and each conductive struct are spaced from each other, and the conductive structs 12 are fixedly connected with the fixed parts 14 and remain stationary. In FIG. 15, the conductive deformable crossbeams 13 and the conductive structs 12 are symmetrically arranged on two sides of the circular groove 304.

Figure 16:
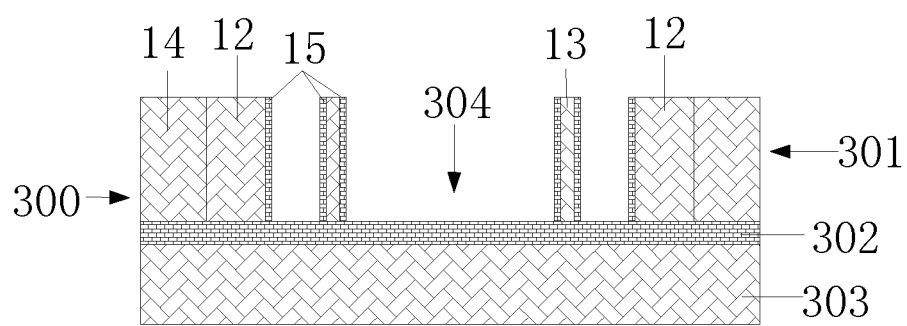

As shown in FIG. 16, a dielectric layer 15 including silicon oxide is deposited on the top silicon layer 301. A photoresist layer may be coated on the dielectric layer 15 and an etching process is performed on the photoresist layer almost similarly to FIG. 15. The differences between FIG. 15 and FIG. 16 are that, in FIG. 16, the dielectric layer 15 on a side wall of the conductive deformable crossbeams 13 and the conductive structs 12 and silicon oxide between the adjacent fixed parts 14 are remained.

Figure 17:
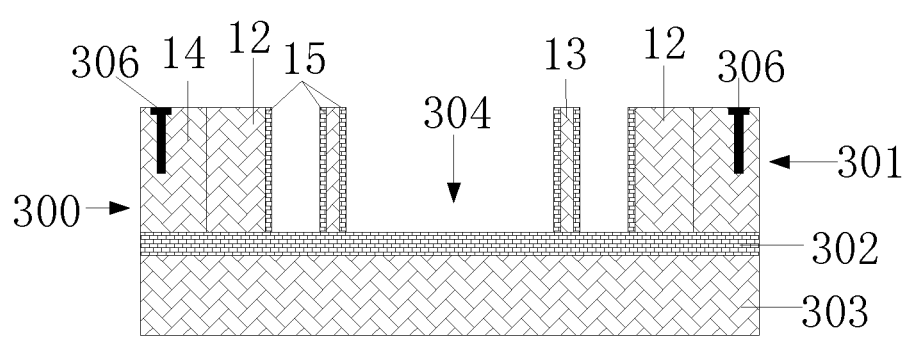

As shown in FIG. 17, a metal interconnect and a pad 306 are formed on the fixed parts 14. In some embodiments, a metal interconnect and a pad 306 may be formed on the conductive deformable crossbeams 13 and the conductive structs 12. A process for forming the metal interconnect and the pad 306 may be similar with a process for manufacturing a metal interconnect in an integrated circuit and not described in detail here.

Figure 18:
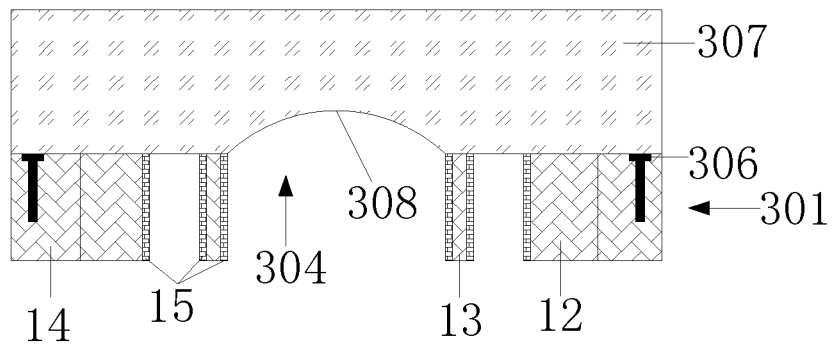

As shown in FIG. 18, a glass plate 307 is adhered on an upper surface of the conductive deformable crossbeams 13 and the conductive structs 12, where a surface of the glass plate 307 which is opposite to the circular groove 304 has a circular pit 308 thereon, another surface of the glass plate 307 is flat. The bottom silicon layer 303 and the buried layer 302 are removed, and the multiple groups of conductive deformable crossbeams 13 and conductive structs 12 are released to enable the conductive deformable crossbeams 13 to be suspended in the air.

Figure 19:
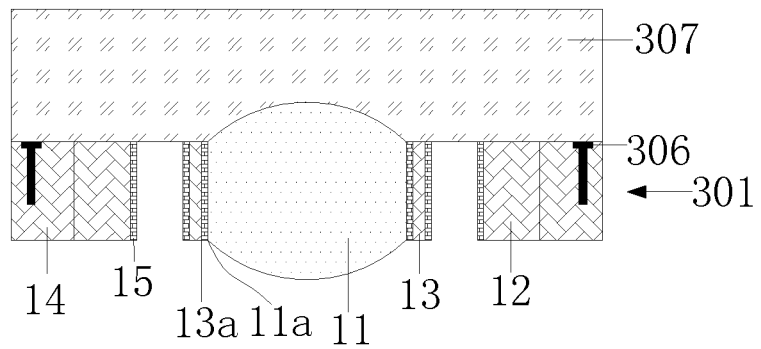

As shown in FIG. 19, drops of heated transparent plastic are injected into the circular groove 304, the heated transparent plastic is molded on a lower surface of the top silicon layer 301 by employing a casting module having a circular pit to form a deformable lens 11 with a convex external surface, external edges 11a of the deformable lens 11 are fixedly connected with the inner edges 13a of the conductive deformable crossbeams 13, and the casting module is removed.

Figure 20:
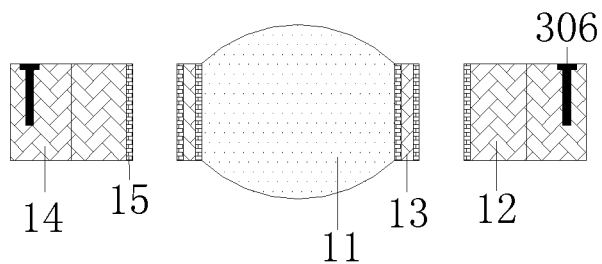

As shown in FIG. 20, the glass plate 307 is removed.

It is known to those skilled in the art that, since FIG. 20 is a sectional view, it is not shown in FIG. 20 that, external edges of the conductive deformable crossbeams 13 are fixedly connected with the fixed parts 14.

In some embodiments, the surface of the glass plate 307 which is opposite to the circular groove 304 may have a circular protrusion, the heated transparent plastic on the lower surface of the top silicon layer 301 by employing a casting module having a circular protrusion to form a deformable lens with a concave external surface, where a process for forming the deformable lens with the concave external surface may be similar with the process for forming the deformable lens with the convex external surface described above and not described in detail here.

Figure 21:
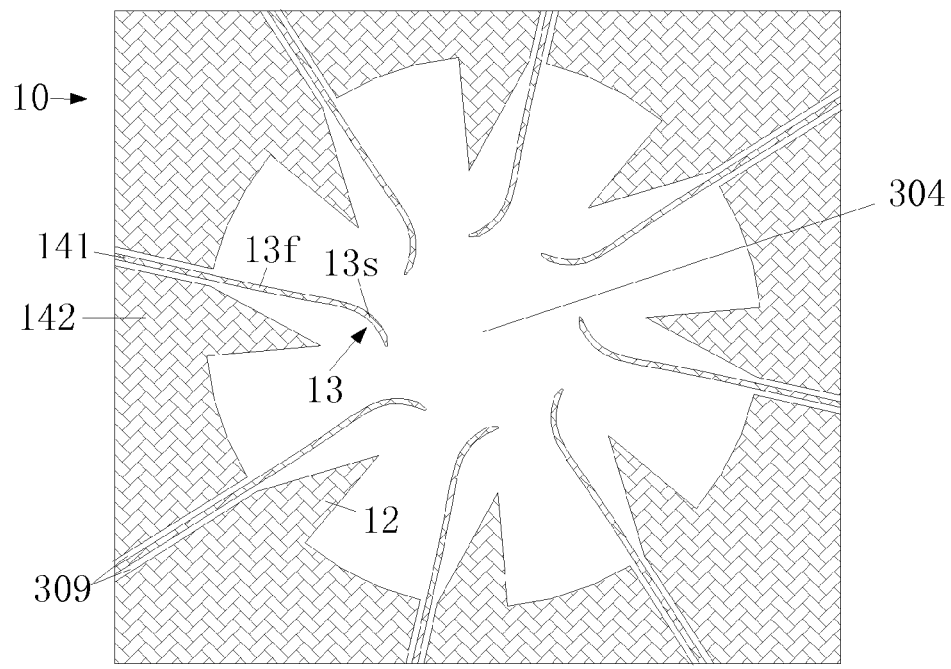
FIGS. 21 to 23 schematically illustrate vertical views of intermediate structures of a method for manufacturing a MEMS based focusing device according to one embodiment of the present disclosure.
Figure 22:
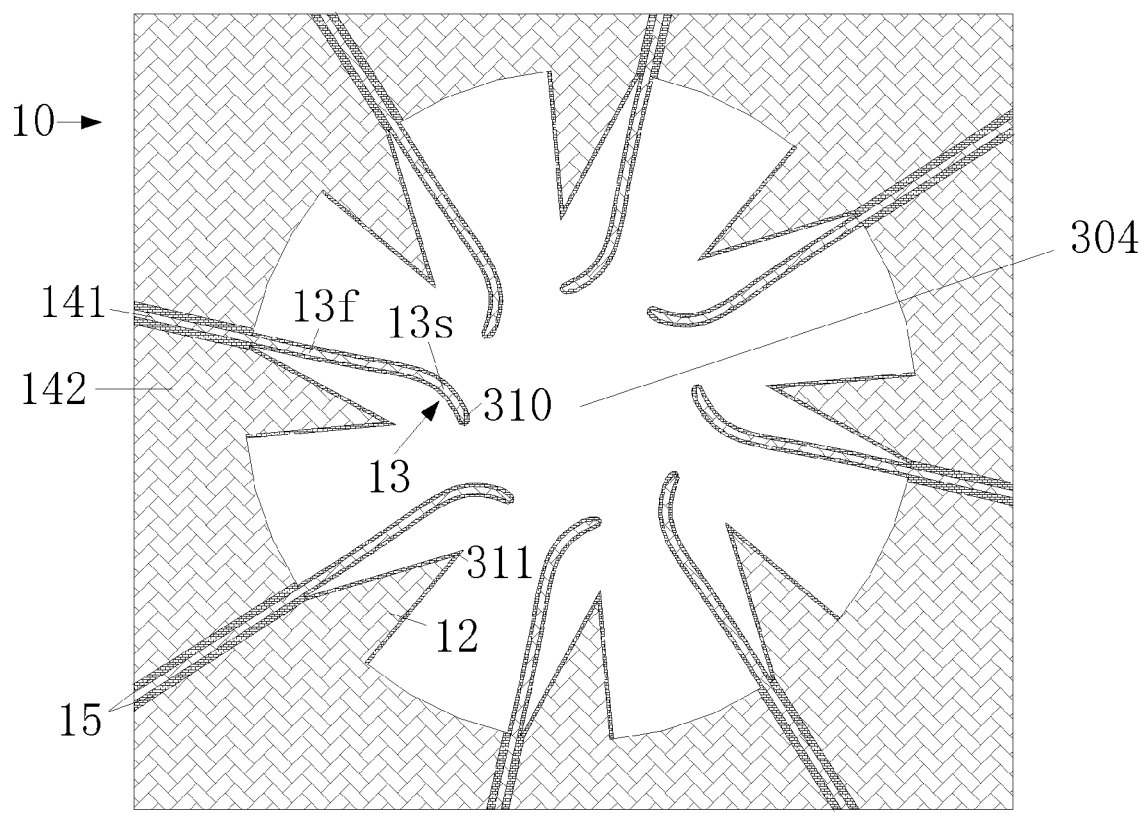
Figure 23:
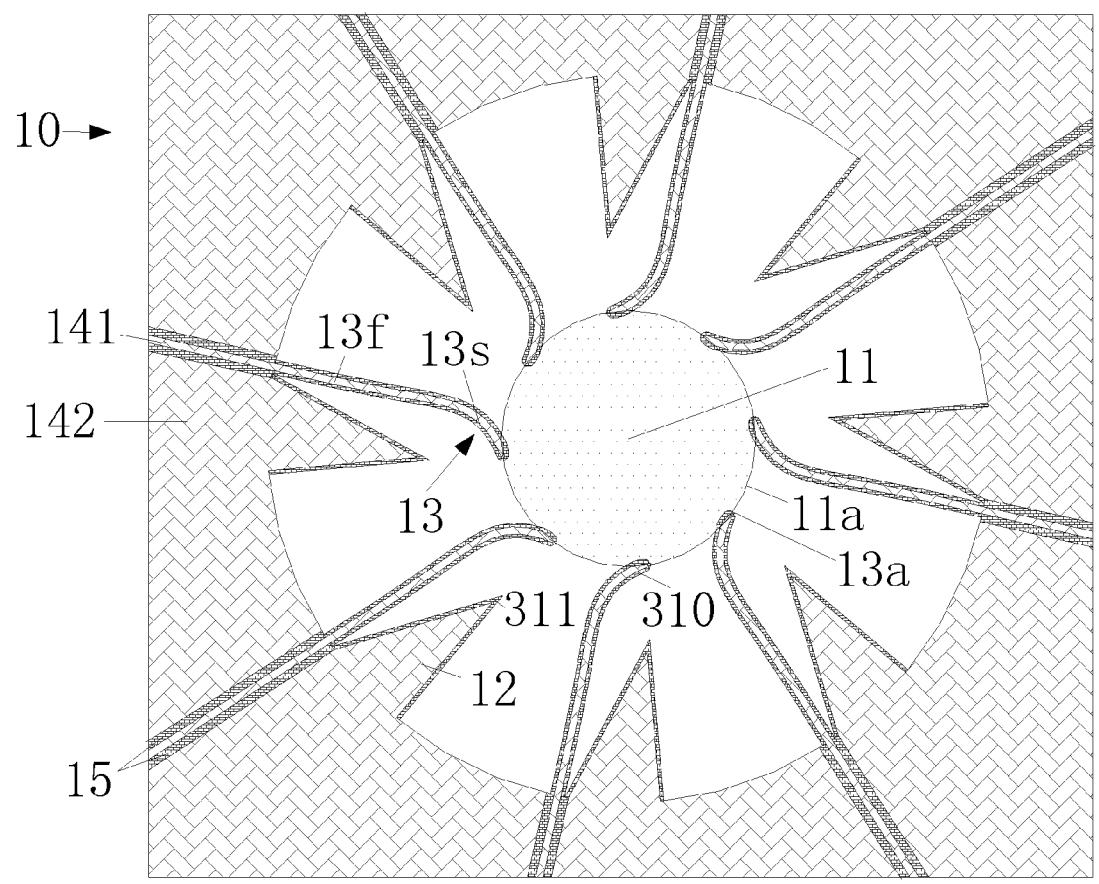

FIGS. 21 to 23 schematically illustrate vertical views of intermediate structures of a method for manufacturing a MEMS based focusing device according to one embodiment of the present disclosure and correspond to FIGS. 15 to 20. To show structures formed by the method conveniently, a lower layer of a substrate, a plate and a casting module are not shown in FIGS. 21 to 23. As shown in FIG. 21, a SOI substrate is provided, which includes a bottom silicon layer, a buried layer and a top silicon layer from bottom to top. The top silicon layer is etched by dry etching or wet etching to form eight groups of conductive deformable crossbeams 13 and conductive structs 12 and a plurality of fixed parts 141 and 142. A circular groove 304 is formed in the center of inner edges of the conductive deformable crossbeams 13. In each group of the conductive deformable crossbeam 13 and the conductive struct 12, each conductive deformable crossbeam 13 corresponds to an adjacent conductive struct 12, the conductive deformable crossbeams 13 and the conductive structs 12 are arranged around the circular groove 304, each conductive deformable crossbeam 13 and each conductive struct 12 are spaced from each other, the eight groups of conductive deformable crossbeams 13 and the conductive structs 12 are symmetrically arranged around the circular groove 304, along a radial direction of the circular groove 304 outwardly, a distance between the conductive deformable crossbeam 13 and the conductive struct 12 in each group may decrease gradually, each of the conductive deformable crossbeams 13 may take a shape of sickle which includes a bending part 13s and a flat part 13f, an angle between an inner side of the flat part 13f and an inner side of the conductive struct 12 which are opposite in each group may be 15°, external edges of the conductive deformable crossbeams 13 are fixedly connected with the fixed parts 141, and the conductive structs 12 are fixedly connected with the fixed parts 142 and remain stationary. Besides, a groove 309 is formed between the adjacent fixed parts by an etching process.

As shown in FIG. 22, a dielectric layer including silicon oxide is deposited on the top silicon layer. A photoresist layer may be coated on the dielectric layer and an etching process is performed on the photoresist layer, remaining a dielectric layer 310 on a side wall of the conductive deformable crossbeams 13, a dielectric layer 311 on a side wall of the conductive structs 12 and a dielectric layer 15 between the adjacent fixed parts.

As shown in FIG. 23, a glass plate is adhered on an upper surface of the conductive deformable crossbeams 13 and the conductive structs 12, where a surface of the glass plate which is opposite to the circular groove 304 has a circular pit thereon, another surface of the glass plate is flat. The bottom silicon layer and the buried layer are removed, and the eight groups of conductive deformable crossbeams 13 and conductive structs 12 are released to enable the conductive deformable crossbeams 13 to be suspended in the air. Drops of heated transparent plastic are injected into the circular groove 304, the heated transparent plastic is molded on a lower surface of the top silicon layer by employing a casting module having a circular pit to form a deformable lens 11 with a convex external surface, external edges 11a of the deformable lens 11 are fixedly connected on the inner edges 13a of the conductive deformable crossbeams 13, and the casting module and the glass plate are removed.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A micro-electro-mechanical system based focusing device, comprising:

a deformable lens having a surface curvature and a focal length, wherein the surface curvature and focal length change in response to a deformation of the deformable lens;

multiple groups of conductive deformable crossbeams and conductive structures, wherein each group, each conductive deformable crossbeam corresponds to an adjacent conductive structure, the conductive deformable crossbeams and the conductive structures are arranged around the deformable lens, each conductive deformable crossbeam and each conductive structure are spaced from each other, the conductive deformable crossbeams are suspended in the air, and inner edges of the conductive deformable crossbeams are fixedly connected with an external edge of the deformable lens; and one or more fixed parts, wherein external edges of the conductive deformable crossbeams are fixedly connected with the fixed parts, and the conductive structures are fixedly connected with the fixed parts and remain stationary, and wherein electrostatic force between the conductive deformable crossbeam and the conductive structure in each group enables the conductive deformable crossbeam to have an opposite charge as a charge of the corresponding adjacent conductive structure thereby attracting the conductive deformable crossbeam and the corresponding adjacent conductive structure to each other, so that the deformable lens is stretched and rotates around an optical axis of the deformable lens clockwise or anticlockwise, and further surface curvature and focal length of the deformable lens are changed.

2. The micro-electro-mechanical system based focusing device according to claim 1, wherein the multiple groups of conductive deformable crossbeams and conductive structures are symmetrically arranged around the deformable lens with respect to the optical axis thereof.

3. The micro-electro-mechanical system based focusing device according to claim 1, wherein along a radial direction of the deformable lens outwardly, a distance between the conductive deformable crossbeam and the conductive structure in each group decreases gradually.

4. The micro-electro-mechanical system based focusing device according to claim 1, wherein each of the conductive deformable crossbeam takes a shape of sickle which comprises a bending part and a flat part, and an inner edge of the bending part is fixedly connected with the external edge of the deformable lens.

5. The micro-electro-mechanical system based focusing device according to claim 1, wherein along a radial direction of the deformable lens, each conductive deformable crossbeam has a flat side.

6. The micro-electro-mechanical system based focusing device according to claim 1, wherein the conductive deformable crossbeams comprise a plurality of first conductive deformable crossbeams and a plurality of second conductive deformable crossbeams, and the conductive structures comprise a plurality of first conductive structures which correspond to the plurality of first conductive deformable crossbeams and a plurality of second conductive structures which correspond to the plurality of second conductive deformable crossbeams, where the plurality of first conductive deformable crossbeams and the plurality of second conductive deformable crossbeams are arranged around the deformable lens, each first conductive deformable crossbeam and each second conductive deformable crossbeam are spaced from each other, the plurality of first conductive structures and the plurality of second conductive structures are arranged around the deformable lens, and each first conductive structure and each second conductive structure are spaced from each other; and when the conductive deformable crossbeam and the conductive structure in each group have opposite charges, the first conductive deformable crossbeam and the second conductive deformable crossbeam have opposite charges and the first conductive structure and the second conductive structure have opposite charges.

7. The micro-electro-mechanical system based focusing device according to claim 6, wherein an angle is formed between an inner side of the flat part of the conductive deformable crossbeam and an inner side of the conductive structure which are opposite in each group, and when electrostatic attraction occurs between the conductive deformable crossbeam and the conductive structure, a distance therebetween decreases.

8. The micro-electro-mechanical system based focusing device according to claim 1, wherein a dielectric layer is formed on inner sides of the conductive deformable crossbeam and the conductive structure which are opposite in each group.

9. The micro-electro-mechanical system based focusing device according to claim 1, further comprising one or more adjustable power supply devices and one or more charge removing devices, wherein the one or more adjustable power supply devices are configured to provide charges to the conductive deformable crossbeams and the conductive structures, and the one or more charge removing devices are configured to remove charges on the conductive deformable crossbeams and the conductive structures.

10. A method for manufacturing a micro-electro-mechanical system based focusing device, comprising:
providing a semiconductor substrate;
etching an upper layer of the semiconductor substrate by dry etching or wet etching to form multiple groups of conductive deformable crossbeams and conductive structures and one or more fixed parts, and forming a circular groove in the center of inner edges of the conductive deformable crossbeams, where in each group of conductive deformable crossbeam and conductive structure, each conductive deformable crossbeam corresponds to an adjacent conductive structure, the conductive deformable crossbeams and the conductive structures are arranged around the circular groove, each conductive deformable crossbeam and each conductive structure are spaced from each other, external edges of the conductive deformable crossbeams are fixedly connected with the fixed parts, and the conductive structures are fixedly connected with the fixed parts and remain stationary;
adhering a plate on an upper surface of the semiconductor substrate;
thinning a lower layer of the semiconductor substrate, releasing the multiple groups of conductive deformable crossbeams and conductive structures to make the conductive deformable crossbeams suspended in the air;
forming a deformable lens in the circular groove, the deformable lens having a shape that can be changed by applying opposite charges to the conductive deformable crossbeam and the corresponding adjacent conductive structure thereby attracting the conductive deformable crossbeam and the corresponding adjacent conductive structure to each other, an external edge of the deformable lens being fixedly connected with the inner edges of the conductive deformable crossbeams; and
removing the plate.

11. The method according to claim 10, further comprising:
before thinning the lower layer of the semiconductor substrate, depositing a dielectric layer on a side wall of the conductive deformable crossbeams and the conductive structures; and depositing a dielectric layer between any two adjacent fixed parts.

12. The method according to claim 10, wherein the semiconductor substrate is a silicon-on-insulator substrate, wherein the upper layer of the semiconductor substrate comprises a top silicon layer of the silicon-on-insulator substrate and the lower layer of the semiconductor substrate comprises a buried layer and a bottom semiconductor layer of the silicon-on-insulator substrate.

13. The method according to claim 10, further comprising:
before thinning the lower layer of the semiconductor substrate, forming a metal interconnect and a pad on the conductive deformable crossbeams, the conductive structures or the fixed parts.

14. The method according to claim 10, wherein during the process of etching the upper layer of the semiconductor substrate by dry etching or wet etching to form the multiple groups of conductive deformable crossbeams and conductive structures and the one or more fixed parts, the multiple groups of conductive deformable crossbeams and the conductive structures are symmetrically arranged around the circular groove.

15. The method according to claim 10, wherein during the process of etching the upper layer of the semiconductor substrate by dry etching or wet etching to form the multiple groups of conductive deformable crossbeams and conductive structures and the one or more fixed parts, along a radial direction of the deformable lens outwardly, a distance between the conductive deformable crossbeam and the conductive structure in each group decreases gradually.

16. The method according to claim 10, wherein during the process of etching the upper layer of the semiconductor substrate by dry etching or wet etching to form the multiple groups of conductive deformable crossbeams and conductive structures and the one or more fixed parts, each of the conductive deformable crossbeam takes a shape of sickle which comprises a bending part and a flat part.

17. The method according to claim 10, wherein during the process of etching the upper layer of the semiconductor substrate by dry etching or wet etching to form the multiple groups of conductive deformable crossbeams and conductive structures and the one or more fixed parts, along a radial direction of the circular groove, each conductive deformable crossbeam has a flat side.

18. The method according to claim 10, wherein during the process of etching the upper layer of the semiconductor substrate by dry etching or wet etching to form the multiple groups of conductive deformable crossbeams and conductive structures and the one or more fixed parts, the conductive deformable crossbeams comprise a plurality of first conductive deformable crossbeams and a plurality of second conductive deformable crossbeams, and the conductive structures comprise a plurality of first conductive structures which correspond to the plurality of first conductive deformable crossbeams and a plurality of second conductive structures which correspond to the plurality of second conductive deformable crossbeams, where the plurality of first conductive deformable crossbeams and the plurality of second conductive deformable crossbeams are arranged around the circular groove, each first conductive deformable crossbeam and each second conductive deformable crossbeam are spaced from each other, the plurality of first conductive structures and the plurality of second conductive structures are arranged around the circular groove, and each first conductive structure and each second conductive structure are spaced from each other.

19. The method according to claim 10, wherein forming the deformable lens in the circular groove comprises:
    injecting drops of the heated transparent plastic into the circular groove;
    molding the heated transparent plastic on a surface of the semiconductor substrate after thinning by employing a casting module having a circular protrusion or a circular pit to form a deformable lens with an convex external surface or an concave external surface;
    fixedly connecting the external edge of the deformable lens with the inner edges of the conductive deformable crossbeams; and
    removing the casting module.

20. The method according to claim 13, further comprising:
    after removing the plate, forming an electric connection among the pad, an adjustable power supply device and a charge removing device in an external circuit through lead wires.

* * * * *